United States Patent
Reid et al.

(10) Patent No.: US 8,308,931 B2
(45) Date of Patent: Nov. 13, 2012

(54) METHOD AND APPARATUS FOR ELECTROPLATING

(75) Inventors: Jonathan Reid, Sherwood, OR (US);
Bryan Buckalew, Tualatin, OR (US);
Zhian He, Beaverton, OR (US); Seyang Park, Beaverton, OR (US); Seshasayee Varadarajan, Lake Oswego, OR (US);
Bryan Pennington, Tualatin, OR (US);
Thomas Ponnuswamy, Sherwood, OR (US); Patrick Breling, Portland, OR (US); Glenn Ibarreta, Ridgefield, WA (US); Steven Mayer, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 788 days.

(21) Appl. No.: 12/291,356

(22) Filed: Nov. 7, 2008

(65) Prior Publication Data

US 2010/0032310 A1 Feb. 11, 2010

Related U.S. Application Data

(63) Continuation-in-part of application No. 11/506,054, filed on Aug. 16, 2006, now Pat. No. 7,854,828.

(51) Int. Cl.
*C25D 21/12* (2006.01)
*C25D 7/12* (2006.01)
*C25D 3/38* (2006.01)

(52) U.S. Cl. .......................... 205/96; 205/97; 204/230.7

(58) Field of Classification Search .................. None
See application file for complete search history.

(56) References Cited

U.S. PATENT DOCUMENTS

| | | | |
|---|---|---|---|
| 3,652,442 A | 3/1972 | Powers et al. |
| 3,706,651 A | 12/1972 | Leland |
| 3,862,891 A | 1/1975 | Smith |
| 3,880,725 A | 4/1975 | Van Raalte et al. |
| 4,033,833 A | 7/1977 | Bestel et al. |
| 4,082,638 A | 4/1978 | Jumer |
| 4,240,886 A | 12/1980 | Hodges et al. |

(Continued)

FOREIGN PATENT DOCUMENTS

CA 1 236 627 7/1986

(Continued)

OTHER PUBLICATIONS

Fang et al., "Uniform Copper Electroplating on Resistive Substrates," Abs. 167, 205$^{th}$ Meeting, © 2004 The Electrochemical Society, Inc., 1 page.

(Continued)

*Primary Examiner* — Harry D Wilkins, III
(74) *Attorney, Agent, or Firm* — Weaver Austin Villeneuve & Sampson LLP

(57) ABSTRACT

An apparatus for electroplating a layer of metal on the surface of a wafer includes an ionically resistive ionically permeable element located in close proximity of the wafer (preferably within 5 mm of the wafer surface) which serves to modulate ionic current at the wafer surface, and a second cathode configured to divert a portion of current from the wafer surface. The ionically resistive ionically permeable element in a preferred embodiment is a disk made of a resistive material having a plurality of perforations formed therein, such that perforations do not form communicating channels within the body of the disk. The provided configuration effectively redistributes ionic current in the plating system allowing plating of uniform metal layers and mitigating the terminal effect.

34 Claims, 25 Drawing Sheets

U.S. PATENT DOCUMENTS

| | | | |
|---|---|---|---|
| 4,272,335 A | 6/1981 | Combs | |
| 4,304,641 A | 12/1981 | Grandia et al. | |
| 4,389,297 A | 6/1983 | Korach | |
| 4,409,339 A | 10/1983 | Matsuda et al. | |
| 4,469,564 A | 9/1984 | Okinaka et al. | |
| 4,545,877 A | 10/1985 | Hillis | |
| 4,604,177 A | 8/1986 | Sivilotti | |
| 4,604,178 A | 8/1986 | Fiegener et al. | |
| 4,605,482 A | 8/1986 | Shirgami et al. | |
| 4,696,729 A | 9/1987 | Santini | |
| 4,828,654 A | 5/1989 | Reed | |
| 4,906,346 A | 3/1990 | Hadersbeck et al. | |
| 4,931,149 A | 6/1990 | Stierman et al. | |
| 4,933,061 A | 6/1990 | Kulkarni et al. | |
| 4,988,417 A | 1/1991 | DeYoung | |
| 5,035,784 A | 7/1991 | Anderson et al. | |
| 5,039,381 A | 8/1991 | Mullarkey | |
| 5,078,852 A | 1/1992 | Yee et al. | |
| 5,096,550 A | 3/1992 | Mayer et al. | |
| 5,146,136 A | 9/1992 | Ogura et al. | |
| 5,156,730 A | 10/1992 | Bhatt et al. | |
| 5,162,079 A | 11/1992 | Brown | |
| 5,169,684 A | 12/1992 | Takagi | |
| 5,217,586 A | 6/1993 | Datta et al. | |
| 5,312,352 A | 5/1994 | Leschinsky et al. | |
| 5,312,532 A | 5/1994 | Andricacos et al. | |
| 5,316,642 A | 5/1994 | Young, Jr. et al. | |
| 5,368,711 A | 11/1994 | Poris | |
| 5,391,285 A | 2/1995 | Lytle et al. | |
| 5,421,987 A | 6/1995 | Tzanavaras et al. | |
| 5,443,707 A | 8/1995 | Mori | |
| 5,472,592 A | 12/1995 | Lowery | |
| 5,476,578 A | 12/1995 | Forand | |
| 5,498,325 A | 3/1996 | Nishimura et al. | |
| 5,516,412 A | 5/1996 | Andricacos et al. | |
| 5,567,300 A | 10/1996 | Datta et al. | |
| 5,620,581 A | 4/1997 | Ang | |
| 5,660,699 A | 8/1997 | Saito et al. | |
| 5,723,028 A | 3/1998 | Poris | |
| 5,744,019 A | 4/1998 | Ang | |
| 5,774,019 A | 6/1998 | Koyama et al. | |
| 5,935,402 A | 8/1999 | Fanti | |
| 6,004,440 A | 12/1999 | Hanson et al. | |
| 6,027,631 A | 2/2000 | Broadbent | |
| 6,071,388 A | 6/2000 | Uzoh | |
| 6,074,544 A | 6/2000 | Reid et al. | |
| 6,080,291 A | 6/2000 | Woodruff et al. | |
| 6,099,702 A | 8/2000 | Reid et al. | |
| 6,106,687 A | 8/2000 | Edelstein | |
| 6,110,346 A | 8/2000 | Reid et al. | |
| 6,126,798 A | 10/2000 | Reid et al. | |
| 6,132,587 A | 10/2000 | Jorne et al. | |
| 6,132,805 A | 10/2000 | Moslehi | |
| 6,156,167 A | 12/2000 | Patton et al. | |
| 6,162,344 A | 12/2000 | Reid et al. | |
| 6,168,693 B1 | 1/2001 | Uzoh et al. | |
| 6,174,425 B1 | 1/2001 | Simpson et al. | |
| 6,179,983 B1 | 1/2001 | Reid et al. | |
| 6,193,860 B1 | 2/2001 | Weling | |
| 6,228,231 B1 | 5/2001 | Uzoh | |
| 6,251,255 B1 | 6/2001 | Copping et al. | |
| 6,261,433 B1* | 7/2001 | Landau | 205/96 |
| 6,322,674 B1 | 11/2001 | Berner et al. | |
| 6,368,475 B1 | 4/2002 | Hanson et al. | |
| 6,391,166 B1 | 5/2002 | Wang | |
| 6,391,188 B1 | 5/2002 | Goosey | |
| 6,395,152 B1 | 5/2002 | Wang | |
| 6,398,926 B1 | 6/2002 | Mahneke | |
| 6,402,923 B1 | 6/2002 | Mayer et al. | |
| 6,497,801 B1 | 12/2002 | Woodruff et al. | |
| 6,521,102 B1 | 2/2003 | Dordi | |
| 6,527,920 B1 | 3/2003 | Jackson et al. | |
| 6,551,483 B1* | 4/2003 | Mayer et al. | 205/81 |
| 6,569,299 B1 | 5/2003 | Reid et al. | |
| 6,599,412 B1 | 7/2003 | Graham et al. | |
| 6,627,051 B2* | 9/2003 | Berner et al. | 204/222 |
| 6,632,335 B2* | 10/2003 | Kunisawa et al. | 204/230.2 |
| 6,716,334 B1 | 4/2004 | Reid et al. | |
| 6,755,954 B2 | 6/2004 | Mayer et al. | |
| 6,773,571 B1 | 8/2004 | Mayer et al. | |
| 6,821,407 B1 | 11/2004 | Reid et al. | |
| 6,843,894 B2 | 1/2005 | Berner et al. | |
| 6,890,416 B1 | 5/2005 | Mayer et al. | |
| 6,919,010 B1 | 7/2005 | Mayer | |
| 6,921,468 B2 | 7/2005 | Graham et al. | |
| 6,964,792 B1 | 11/2005 | Mayer et al. | |
| 7,070,686 B2 | 7/2006 | Contolini et al. | |
| 7,169,705 B2 | 1/2007 | Ide et al. | |
| D544,452 S | 6/2007 | Nakamura et al. | |
| D548,705 S | 8/2007 | Hayashi | |
| D552,565 S | 10/2007 | Nakamura et al. | |
| D553,104 S | 10/2007 | Oohashi et al. | |
| 7,323,094 B2 | 1/2008 | Simpson et al. | |
| D587,222 S | 2/2009 | Sasaki et al. | |
| 7,622,024 B1* | 11/2009 | Mayer et al. | 204/198 |
| 7,641,776 B2 | 1/2010 | Nagar et al. | |
| D609,652 S | 2/2010 | Nagasaka et al. | |
| D609,655 S | 2/2010 | Sugimoto | |
| 7,670,465 B2 | 3/2010 | Yang et al. | |
| 7,682,498 B1 | 3/2010 | Mayer et al. | |
| D614,593 S | 4/2010 | Lee et al. | |
| 7,837,841 B2 | 11/2010 | Chen et al. | |
| 7,854,828 B2 | 12/2010 | Reid et al. | |
| 7,935,240 B2 | 5/2011 | Singh et al. | |
| 7,967,969 B2* | 6/2011 | Mayer et al. | 205/97 |
| D648,289 S | 11/2011 | Mayer et al. | |
| 2002/0017456 A1 | 2/2002 | Graham et al. | |
| 2002/0020627 A1 | 2/2002 | Kunisawa et al. | |
| 2002/0119671 A1* | 8/2002 | Lee | 438/745 |
| 2002/0125141 A1 | 9/2002 | Wilson et al. | |
| 2003/0029527 A1 | 2/2003 | Yajima et al. | |
| 2003/0038035 A1 | 2/2003 | Wilson et al. | |
| 2003/0102210 A1 | 6/2003 | Woodruff et al. | |
| 2003/0201166 A1* | 10/2003 | Zheng et al. | 204/228.1 |
| 2004/0149584 A1* | 8/2004 | Nagai et al. | 205/103 |
| 2005/0145499 A1 | 7/2005 | Kovarsky et al. | |
| 2006/0243598 A1 | 11/2006 | Singh et al. | |
| 2007/0029193 A1* | 2/2007 | Brcka | 204/298.02 |
| 2007/0068819 A1 | 3/2007 | Singh et al. | |
| 2007/0238265 A1 | 10/2007 | Kurashina et al. | |
| 2010/0032304 A1* | 2/2010 | Mayer et al. | 205/97 |
| 2010/0032310 A1 | 2/2010 | Reid et al. | |
| 2010/0044236 A1* | 2/2010 | Mayer et al. | 205/80 |
| 2010/0116672 A1* | 5/2010 | Mayer et al. | 205/97 |
| 2011/0031112 A1 | 2/2011 | Birang et al. | |

FOREIGN PATENT DOCUMENTS

| | | |
|---|---|---|
| EP | 0037325 | 3/1981 |
| JP | 59-162298 | 9/1984 |
| JP | 09-53197 | 2/1997 |
| JP | 20021316887 | 11/2001 |
| JP | 2003-268591 | 9/2003 |
| KR | 10-0707121 | 4/2007 |
| WO | WO 99/14401 | 3/1999 |
| WO | WO/9941434 | 8/1999 |
| WO | WO 99/64647 | 12/1999 |

OTHER PUBLICATIONS

Malmstadt et al. "Microcomputers and Electronic Instrumentation: Making the Right Connections" American Chemical Society (1994) p. 255.

Mayer et al., "High Resistance Ionic Current Source", U.S. Appl. No. 11/040,359, filed Jan. 20, 2005.

Reid et al, "Method and Apparatus for electroplating Including Remotely Positioned Second Cathode", U.S. Appl. No. 11/506,054, filed Aug. 16, 2006.

Office Action for U.S. Appl. No. 11/040,359, dated Oct. 26, 2007.

Final Office Action for U.S. Appl. No. 11/040,359, dated Jul. 25, 2008.

U.S. Notice of Allowance for Design U.S. Appl. No. 29/377,521 mailed Aug. 10, 2011.

Office Action for U.S. Appl. No. 11/040,359, dated Jan. 8, 2009.

Notice of Allowance and Allowed Claims for U.S. Appl. No. 11/040,359, dated Jul. 20, 2009.

U.S. Office Action for U.S. Appl. No. 12/578,310, mailed Oct. 6, 2010.
Notice of Allowance and Allowed Claims for U.S. Appl. No. 12/578,310, mailed Mar. 4, 2011.
U.S. Office Action for U.S. Appl. No. 11/506,054 mailed May 26, 2010.
Notice of Allowance for U.S. Appl. No. 11/506,054 mailed Aug. 13, 2010.
U.S. Office Action for U.S. Appl. No. 12/481,503 mailed Jun. 24, 2011.
U.S. Office Action for U.S. Appl. No. 12/606,030 mailed Jun. 24, 2011.
International Search Report and Written Opinion for Application No. PCT/US2010/037520 dated Jan. 12, 2011.
Chinese Office Action for 201130081716.6 mailed Jul. 9, 2011.
Mayer et al., "Electroplating Flow Shaping Plate Having Offset Spiral Hole Pattern" Novellus Systems, Inc., Design U.S. Appl. No. 29/377,521, filed Oct. 21, 2010.
Mayer et al., "Control of Electrolyte Hydrodynamics for Efficient Mass Transfer During Electroplating", Novellus Systems, Inc., U.S. Appl. No. 13/172,642, filed Jun. 29, 2011.
Mayer et al., "High Resistance Ionic Current Source" Novellus Systems, Inc., U.S. Appl. No. 13/110,759, filed May 18, 2011.
Mayer et al., "Method and Apparatus for Electroplating," Novellus Systems, Inc., U.S. Appl. No. 12/481,503, filed Jun. 9, 2009.
Mayer et al., "Method and Apparatus for Electroplating," Novellus Systems, Inc., U.S. Appl. No. 12/606,030, filed Oct. 26, 2009.
"Release of Sabre™ electrofill tool with HRVA by Novellus Systems, Inc.", dated prior to the filed of the instant application (3 pages).
Wang, "Plating Apparatus and Method," U.S. Appl. No. 60/074,466, filed Feb. 12, 1998.
U.S. Final Office Action dated Mar. 1, 2012 issued in U.S. Appl. No. 12/481,503.
U.S. Final Office Action dated Mar. 1, 2012 issued in U.S. Appl. No. 12/606,030.

* cited by examiner

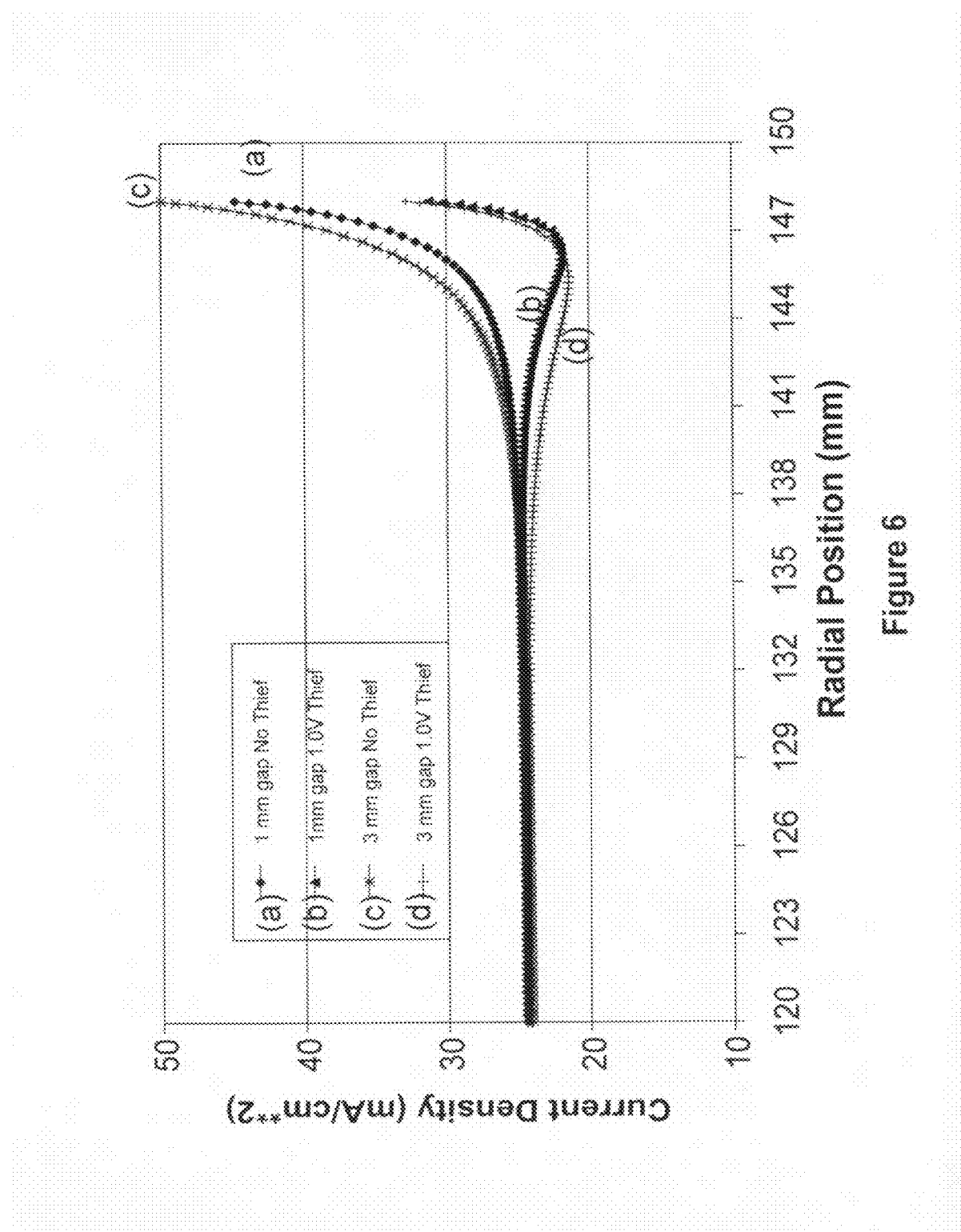

METHOD AND APPARATUS FOR ELECTROPLATING

CROSS-REFERENCE TO RELATED APPLICATIONS

This application is a continuation-in part of U.S. application Ser. No. 11/506,054 titled METHOD AND APPARATUS FOR ELECTROPLATING INCLUDING A REMOTELY POSITIONED SECOND CATHODE filed Aug. 16, 2006 naming Reid et al. as inventors now U.S. Pat. No. 7,854,828, which is herein incorporated by reference in its entirety and for all purposes.

FIELD OF THE INVENTION

The present invention relates generally to a method and apparatus for treating the surface of a substrate and more particularly to a method and apparatus for electroplating a layer on a semiconductor wafer. It is particularly useful for electroplating copper in Damascene and dual Damascene integrated circuit fabrication methods.

BACKGROUND OF THE INVENTION

The transition from aluminum to copper in integrated circuit (IC) fabrication required a change in process "architecture" (to damascene and dual-damascene) as well as a whole new set of process technologies. One process step used in producing copper damascene circuits is the formation of a "seed-" or "strike-" layer, which is then used as a base layer onto which copper is electroplated ("electrofill"). The seed layer carries the electrical plating current from the edge region of the wafer (where electrical contact is make) to all trench and via structures located across the wafer surface. The seed film is typically a thin conductive copper layer. It is separated from the insulating silicon dioxide or other dielectric by a barrier layer. The seed layer deposition process should yield a layer which has good overall adhesion, excellent step coverage (more particularly, conformal/continuous amounts of metal deposited onto the side-walls of an embedded structure), and minimal closure or "necking" of the top of the embedded feature.

Market trends of increasingly smaller features and alternative seeding processes drive the need for a capability to plate with a high degree of uniformity on increasingly thin seeded wafers. In the future, it is anticipated that the seed film may simply be composed of a plateable barrier film, such as ruthenium, or a bilayer of a very thin barrier and copper (deposited, for example, by an atomic layer deposition (ALD) or similar process). These films present the engineer with an extreme terminal effect situation. For example, when driving a 3 amp total current uniformly into a 30 ohm per square ruthenium seed layer (a likely value for a 30-50 Å film) the resultant center to edge voltage drop in the metal will be over 2 volts. To effectively plate a large surface area, the plating tooling makes electrical contact to the conductive seed only in the edge region of the wafer substrate. There is no direct contact made to the central region of the substrate. Hence, for highly resistive seed layers, the potential at the edge of the layer is significantly greater than at the central region of the layer. Without appropriate means of resistance and voltage compensation, this large edge-to-center voltage drop could lead to an extremely non-uniform plating thickness distribution, primarily characterized by thicker plating at the wafer edge. For comparison, the thermodynamic limit of the voltage drop for electrolyte solvent (water) is only about 1.4V.

FIG. 1 is a schematic of an approximated equivalent electrical circuit for the problem. It is simplified to one dimension for clarity. The continuous resistance in the seed layer is represented by a set of finite (in this case four) parallel circuit elements. The in-film resistor elements $R_f$ represent the differential resistance from an outer radial point to a more central radial point on the wafer. The total current supplied at the edge, $I_t$ is distributed to the various surface elements, $I_1$, $I_2$, etc., scaled by the total path resistances with respect to all the other resistances. The circuits more centrally located have a larger total resistance because of the cumulative/additive resistance of the $R_f$ for those paths. Mathematically, the fractional current $F_i$ through any one of the surface element paths is $$F_i = \frac{I_i}{I_t} = \frac{Z_T}{Z_i} = \frac{\frac{1}{(iR_f + R_{ct,i} + Zw_i + R_{el,i})}}{\sum_1^n \frac{1}{iR_f + R_{ct,i} + Zw_i + R_{el,i}}} \quad (1)$$

where n is the total number of parallel paths that the circuit is divided into, i (sometime used as a subscript) refers to the $i^{th}$ parallel current path (from the edge terminal), t refers to the total circuit, I is current, $R_f$ is the resistance in the metal film between each element (constructed, for simplicity, to be the same between each adjacent element), $R_{ct}$ is the local charge transfer resistance, $Z_w$ is the local diffusion (or Warberg) impedance and $R_{el}$ is the electrolyte resistance. With this, $I_i$ is the current to through the $i^{th}$ surface element pathway, and $I_t$ is the total current to the wafer. The charge transfer resistance at each interfacial location is represented by a set of resistors $R_{ct}$ in parallel with the double layer capacitance $C_{dl}$, but for the steady state case does not effect the current distribution. The diffusion resistances, represented by the Warberg impedance (symbol $Z_w$) and the electrolyte resistance ($R_{el}$) are shown in a set of parallel circuit paths, all in series with the particular surface element circuit, give one of several parallel paths for the current to traverse to the anode. In practice, $R_{ct}$ and $Z_w$ are quite non-linear (depending on current, time, concentrations, etc.), but this fact does not diminish the utility of this model in comparing how the current art and this disclosure differ in accomplishing uniform current distribution. To achieve a substantially uniform current distribution, the fractional current should be the same, irrespective of the element position (i). When all terms other than the film resistance term, $R_f$, are relatively small, the current to the $i^{th}$ element is $$F = \frac{\frac{1}{i}}{\sum_1^n \frac{1}{i}} \quad (2)$$

Equation 2 has a strong i (location) dependence and results when no significant current distribution compensating effects are active. In the other extreme, when $R_{ct}$, $Z_w$, $R_{el}$ or the sum of these terms are greater than $R_f$, the fractional current approaches a uniform distribution; the limit of equation 1 as these parameters become large is F=1/n, independent of location i.

Classical means of improving plating non-uniformity draw upon (1) increase $R_{ct}$ through the use of copper complexing agents or charge transfer inhibitors (e.g., plating suppressors and levelers, with the goal of creating a large normal-to-the-surface voltage drop, making $R_f$ small with respect to $R_{cf}$, (2) very high ionic electrolyte resistances (yielding a similar effect through $R_{el}$), (3) creating a significant diffusion resistance ($Z_w$), or (4) variations of a plating current recipe to minimize voltage drop, or control of mass transfer rate to limit current density in areas of high interfacial voltage drop (see e.g., U.S. Pat. Nos. 6,110,346, 6,074,544, and 6,162,344, each of which is incorporated herein by reference).

These approaches have significant limitations related to the physical properties of the materials and the processes. Typical surface polarization derived by organic additives cannot create polarization in excess of about 0.5V (which is a relatively small value in comparison to, for example, the 2V seed layer voltage drop that must be compensated as noted above). Also, because the conductivity of a plating bath is tied to its ionic concentration and pH, decreasing the conductivity directly and negatively impacts the rate of plating and morphology of the plated material.

What is needed therefore is an improved technique for uniform electroplating onto thin-metal seeded wafers, particularly wafers with large diameters (e.g. 300 mm).

In a separate but related aspect, there is a need for developing a wafer-to-electrolyte entry process that is compatible with techniques used for uniform electroplating. This is important because conditions used during immersion of a wafer into electrolyte largely determine success of subsequent plating. In general, entry of a wafer carrying a thin seed layer into electrolyte can lead to a number of serious performance and feature filling issues if entry is not properly controlled (see for example, U.S. Pat. No. 6,946,065, which is herein incorporated by reference in its entirety and for all purposes.).

Wafer entry can fall into three major process classes: cold, hot and potentiostatic. In cold entry, polarization and plating of the wafer is delayed until the wafer entry into electrolyte is complete. Because of corrosive nature of electrolyte, delayed wafer polarization can result in seed layer corrosion and formation of voids at the bottoms of the features. In hot entry, the wafer is polarized prior to or during entry such that the total current requested of the power supply is substantially fixed and, therefore, current density experienced by the wafer during entry into electrolyte depends on the area of wetted portions of the wafer. The current density is greatest (and is often excessive) at the beginning of wafer immersion, when the area of wetted wafer surface is small. As the immersion proceeds further and as larger area of the wafer becomes wetted, the current density experienced by the wafer becomes smaller. Hot entry is superior to cold entry in general, but because current density is starting at a high level and is ending at a low level and because the differences between these can be very substantial, either wafer burning (at high current density) or seed layer corrosion (at low current density) can occur.

In potentiostatic entry the potential between the wafer and a reference electrode carrying no current, is maintained at a fixed value and the current increases approximately linearly with increasing wetted area of the wafer.

With the development of methods and apparatus for reducing the terminal effect, it becomes increasingly important to choose the best compatible wafer entry method, and to adapt it for use with the newly developed system for uniform plating.

SUMMARY

These needs are herein addressed, in one aspect, by providing an electroplating apparatus and a method for uniform electroplating that make use of an ionically resistive element having electrolyte-permeable 1-D through-holes, where the element resides in close proximity of the wafer substrate. The ionically resistive ionically permeable element described herein substantially improves plating uniformity on thin resistive seed layers. It is particularly useful when employed in combination with a second (thief) cathode configured to divert a portion of current from near-edge region of the wafer. It is also compatible with potential-controlled wafer entry, which is, in some embodiments, a preferred wafer entry process for this system. The ionically resistive ionically permeable element described herein serves as a constant current source in the proximity of the wafer cathode and therefore essentially works as a virtual anode. Accordingly, the ionically resistive ionically permeable element will be also referred to as a high-resistance virtual anode (HRVA)

Two features of the HRVA are of particular importance: the placement of HRVA in close proximity with respect to the wafer, and the fact that through-holes in the HRVA are isolated from each other and do not form interconnecting channels within the body of HRVA. Such through-holes will be referred to as 1-D through-holes because they extend in one dimension, typically, but not necessarily normal to the plated surface of the wafer. These through-holes are distinct from 3-D porous networks, where the channels extend in three dimensions and form interconnecting pore structures. An example of a HRVA is a disc made of an ionically resistive material, such as polyethylene, polypropylene, polyvinylidene diflouride (PVDF), polytetrafluoroethylene, polysulphone and the like, having between about 6,000-12,000 1-D through-holes. The disc, in many embodiments, is substantially coextensive with the wafer (e.g., has a diameter of about 300 mm when used with a 300 mm wafer) and resides in close proximity of the wafer, e.g., just below the wafer in a wafer-facing-down electroplating apparatus. Preferably, the plated surface of the wafer resides within about 10 mm, more preferably within about 5 mm of the closest HRVA surface.

The presence of a resistive but ionically permeable element close to the wafer substantially reduces the terminal effect and improves plating uniformity. Importantly, if the same element is placed farther from the wafer, the improvement becomes significantly less pronounced or non-existent. Further, because 1-D through-holes do not allow for lateral movement of ionic current within the HRVA, the center-to-edge current movement is blocked within the HRVA, leading to further improvement in plating uniformity.

Another important feature of the HRVA structure is the diameter or principal dimension of the through-holes and its relation to the distance between the HRVA and the substrate. Preferably the diameter of each through-hole (or of majority of through-holes), should be no more than the distance from the plated wafer surface to the closest surface of the HRVA. Thus, the diameter or principal dimension of the through holes should not exceed 5 mm, when HRVA is placed within about 5 mm of the plated wafer surface.

In some embodiments, the HRVA is used in synergy with a second (thief) cathode which is adapted for diverting a portion of current from the edge of the wafer, thereby even further reducing the terminal effect.

In one aspect, an apparatus for electroplating a layer of metal onto a conductive seed layer of a work piece surface is provided. The apparatus includes: (a) a plating chamber; (b) a work piece holder for holding the work piece in the plating chamber at a position in alignment with an anode; (c) electrical contacts arranged to make electrical connection to the seed layer at one or more locations on the edge regions of the work piece; (d) an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder, during plating in the plating chamber, wherein substantially all perforations have a principal dimension or a diameter of the opening on the surface of the element facing the surface of the work piece of no greater than about 5 mm; and (e) a second cathode adapted for diverting a portion of current from the edge region of the work piece.

In another aspect an electroplating method is provided which involves: (a) providing a work piece having a continuous seed layer of metal disposed on its surface to an electroplating apparatus, wherein the apparatus comprises an ionically resistive ionically permeable element having a plurality of non-communicating perforations and disposed within about 5 mm of the work piece and a second cathode configured to divert a portion of current from an edge region of the work piece; and (b) plating a layer of metal onto the work piece by applying a first level of current to the work piece and a second level of current to the second cathode.

In a separate but related aspect the HRVA having 1-D through-holes is used in conjunction with a static shield (e.g., an insulating ring), which is placed between the plated wafer surface and the HRVA further improving plating uniformity. In one embodiment, an apparatus for electroplating a layer of metal onto a conductive seed layer of a work piece surface having edge regions around a center region includes (a) a plating chamber; (b) a work piece holder for holding the work piece in the plating chamber at a position in alignment with an anode; (c) electrical contacts arranged to make electrical connection to the seed layer at one or more locations on the edge regions; (d) an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder during plating in the plating chamber, wherein substantially all perforations have a principal dimension or a diameter of a perforation opening on the surface of the element facing the surface of the work piece of no greater than about 5 mm; and (e) a static shield positioned to reside in close proximity to the perforations opening of the HRVA between the ionically resistive ionically permeable element and the work piece during plating, wherein the shield is positioned to eclipse at least some of the perforations at the edge region. In some embodiments the apparatus further includes a second cathode adapted to divert a portion of current from the edge of the wafer.

In yet another aspect a wafer entry process has been developed which is compatible with the use of a HRVA having 1-D perforations. The wafer entry process is potential-controlled, while the bulk plating is current-controlled. The apparatus for electroplating configured for potential-controlled wafer entry includes a reference electrode which is positioned preferably in the proximity of the wafer substrate. Importantly, the reference electrode is placed such that it does not reside below HRVA (in a wafer-facing-down apparatus) or above HRVA (in a wafer-facing-up apparatus).

In one embodiment the apparatus includes: (a) a plating chamber adapted for holding an electrolyte; (b) a work piece holder for holding the work piece in the plating chamber at a position in alignment with an anode; (c) one or more electrical power contacts arranged to make electrical connection to the seed layer at one or more locations on the edge regions; (d) an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder, wherein substantially all perforations have a principal dimension or a diameter of the opening on the surface of the element facing the surface of the work piece of no greater than about 5 mm; (e) a reference electrode in operable communication with a control circuit; and (f) a power supply in operable communication with the power contacts, the anode, and with the control circuit, wherein the apparatus is configured for providing a potential-controlled entry of the work piece into the electrolyte.

In another aspect a method for electroplating using a potential-controlled wafer entry is provided. The method includes: (a) providing a wafer substrate having a continuous seed layer of metal disposed on its surface to an electroplating apparatus, wherein the apparatus comprises an ionically resistive ionically permeable element having a plurality of non-communicating perforations; (b) immersing the wafer substrate into an electrolyte solution, wherein the immersing comprises tilting the wafer substrate at an angle relative to a plane defined by the electrolyte and moving the substrate towards and into the electrolyte until an entire working surface of the substrate is immersed in the electrolyte, wherein at least a portion of said immersing is performed while supplying current to the substrate under potential-controlled conditions; (c) changing the tilt angle to bring the working wafer surface to a substantially parallel orientation with the plane of the electrolyte surface during or after the immersion of the substrate; (d) positioning the substrate working surface within about 5 mm of the substrate-proximate surface of the ionically resistive ionically permeable element; and (e) supplying current to the substrate under current-controlled conditions to plate a bulk of the metal layer onto the seed layer.

The use of tilted wafer entry under potential-controlled conditions provides control over current density experienced by the wafer as it is immersed into electrolyte. Because of the potential-controlled entry, burning of the wafer due to excessive current density or corrosion of seed layer due to low current density, can be avoided.

These and other features and advantages of the present invention will be described in more detail below with reference to the associated drawings.

BRIEF DESCRIPTION OF THE DRAWINGS

FIG. 6 shows calculated current density distribution curves as a function of radial position on a wafer for different peripheral gaps in the presence and in the absence of a thief cathode.

DETAILED DESCRIPTION OF A PREFERRED EMBODIMENT

The present invention pertains to methods and apparatus for electroplating a substantially uniform layer of a metal onto a work piece having a seed layer thereon. This invention mitigates or eliminates the terminal problem by placing an ionically resistive element having a large number of isolated and unconnected ionically permeable through-holes (e.g., a resistive disc having multiple perforations allowing for passage of ions) in close proximity to the work piece, thereby dominating or "swamping" the overall system's resistance. The resistive element thus approximates a constant current source. By keeping the work piece close to the resistive element surface, the ionic resistance from the top of the element to the surface is much less than the ionic path resistance from the top of the element to the work piece edge, substantially compensating for the sheet resistance in the thin metal film and directing a significant amount of current over the center of the work piece. The importance of placing the ionically resistive ionically permeable element in close proximity of the substrate is discussed in detail in the U.S. patent application Ser. No. 11/040,359 titled "HIGH RESISTANCE IONIC CURRENT SOURCE" filed on Jan. 20, 2005, naming Steven Mayer et al. as inventors, which is incorporated herein by reference in its entirety and for all purposes.

Importantly, the ionically resistive ionically permeable element provided herein is distinct from microporous plates or discs having continuous three-dimensional networks of pores (e.g. plates made of sintered particles of ceramics or glass). The porous plates having three-dimensional pore networks have intertwining pores through which ionic current can travel laterally (e.g., from the center to the edge of the disc). In contrast, in the provided resistive element the through-holes substantially do not form communicating channels within the body of the element, thereby minimizing lateral movement of ionic current in the element. Current flows in a manner that is one-dimensional, substantially in the vector direction that is normal to the closest plated surface near the resistive element. The one-dimensional isolated channels in the ionically permeable ionically resistive plate are important for minimizing the terminal effect because the possibilities for current redistribution from the center to the edge of the wafer are minimized, and, consequently, plating uniformity is substantially improved.

Figure 1A:
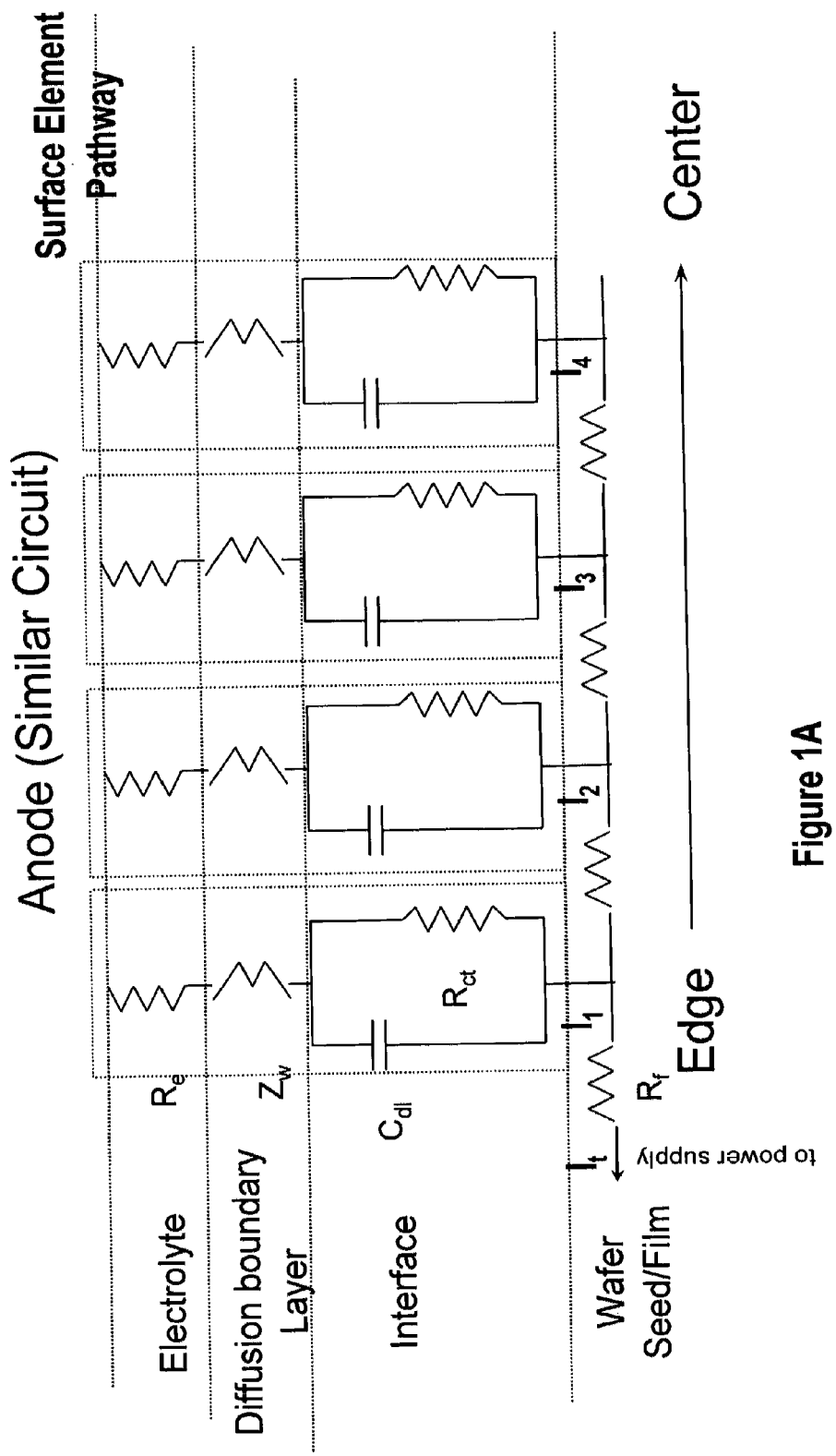
FIG. 1A is a schematic diagram depicting an equivalent circuit for electroplating on a thin seed layer.
Figure 1B:
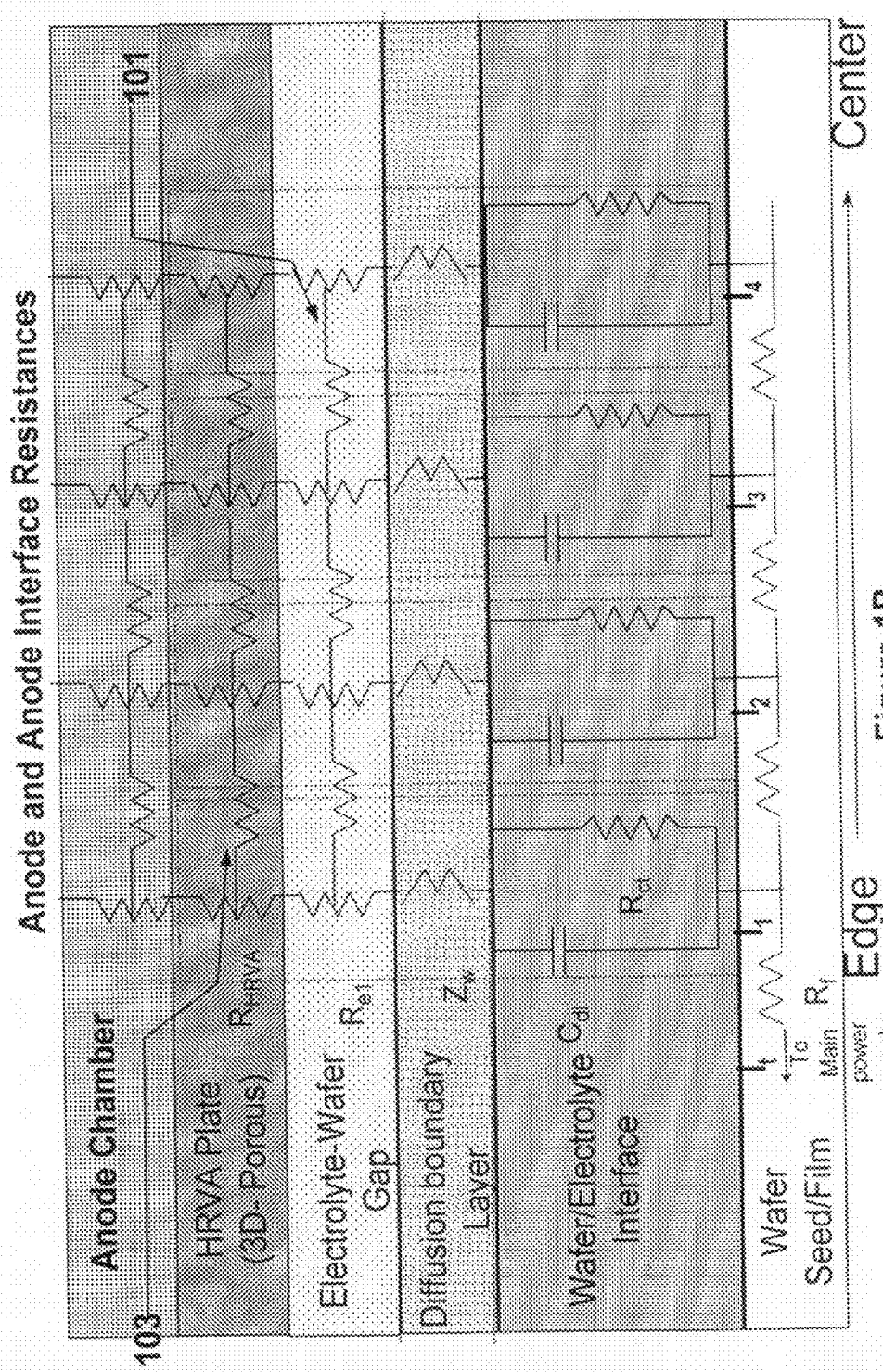
FIG. 1B is a schematic diagram depicting an equivalent circuit for electroplating on a thin seed layer in a presence of an ionically resistive ionically permeable element having 3-D porous network, where the element is disposed at a significant distance from the wafer.
Figure 1C:
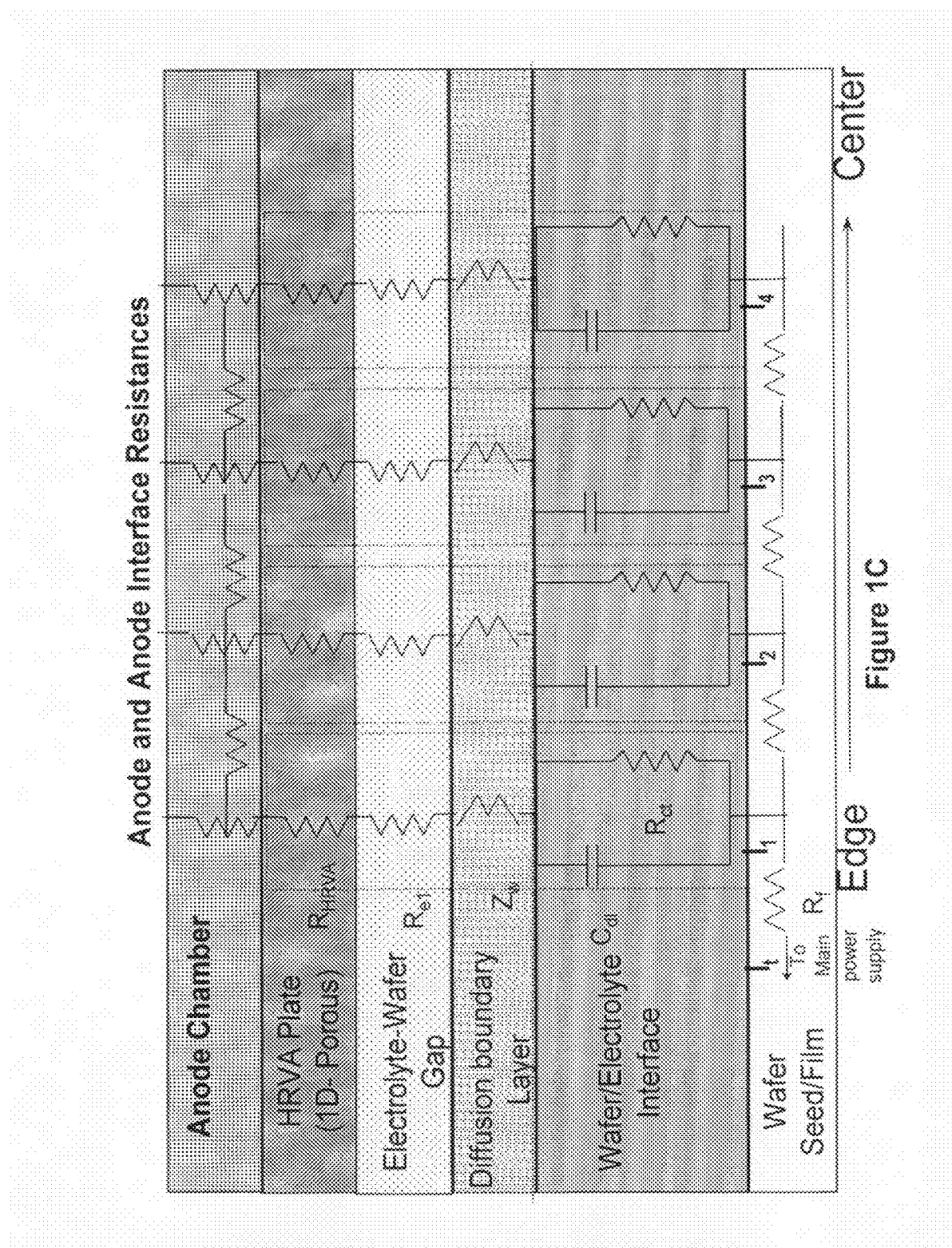
FIG. 1C is a schematic diagram depicting an equivalent circuit for electroplating on a thin seed layer in a presence of an ionically resistive ionically permeable element having 3-D porous network, where the element is disposed at a significant distance from the wafer.

This effect is illustrated in the schematic diagrams shown in FIG. 1B and FIG. 1C depicting equivalent circuits for the plating systems which employ a resistive element having a 3-D porous network (referred to as 3-D porous HRVA) positioned at a significant distance from the wafer (FIG. 1B) and a resistive element having 1-D through holes (referred to as 1-D porous HRVA), positioned in close proximity to the wafer (FIG. 1C). Referring to FIG. 1B, it can be seen that the large gap between the HRVA and the wafer (referred to as electrolyte-wafer gap), allows for significant lateral current flow, 101. Similarly, 3-D porous network within the HRVA, allows for lateral current flow, 103, through lateral pores located inside the HRVA. Both lateral flows contribute to redistribution of current from center to the edge of the wafer leading to increased plating at the wafer edge. In contrast, the 1-D porous HRVA disposed very closely to the wafer, limits the opportunities for current redistribution both in the wafer-electrolyte gap, and within the body of the 1D-porous HRVA itself, as shown in FIG. 2C.

Structure of the Resistive Element

The ionically resistive ionically permeable element having 1D through-holes (also referred to as 1-D porous HRVA) is typically a disk (other shapes may also be used) made of an ionically resistive material having a plurality of holes drilled (or otherwise made) through it. The holes do not form communicating channels within the body of the disk and typically extend through the disk in a direction that is substantially normal to the surface of the wafer. A variety of ionically resistive materials can be used for the disk body, including but not limited to polyethylene, polypropylene, polyvinylidene diflouride (PVDF), polytetrafluoroethylene, polysulphone and the like. Preferably the disk materials are resistant to degradation in acidic electrolyte environment, are relatively hard and are easy to process by machining.

Figure 17:
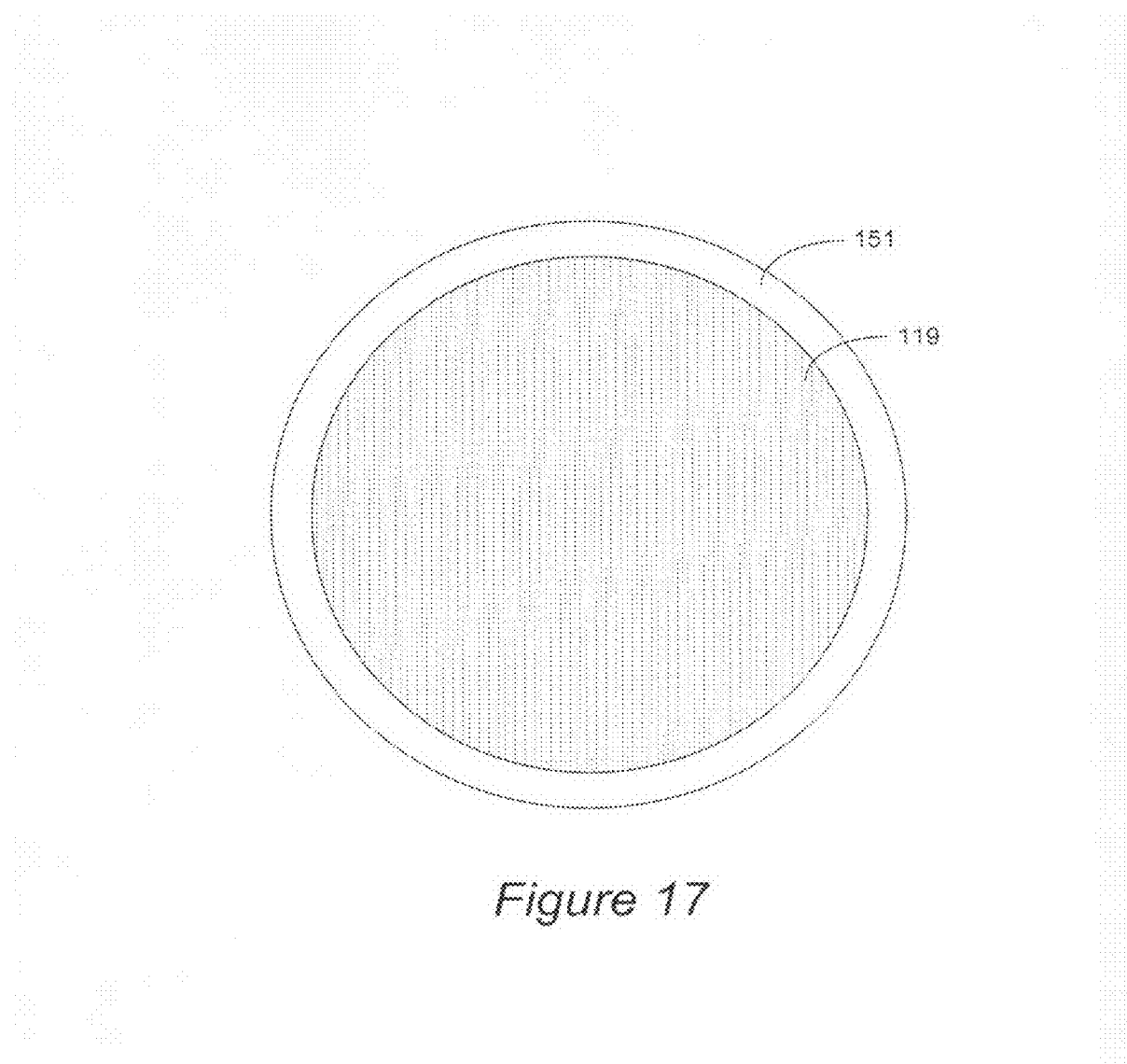
FIG. 17 shows a top view of HRVA and a peripheral shield.

The disc is preferably co-extensive with the wafer, and, therefore, has a diameter that is close to the diameter of the wafer that is being plated. Thus, for example, the disc diameter can range between about 150 mm and 450 mm, with about 200 mm disc being used for a 200 mm wafer, about 300 mm disc for a 300 mm wafer, and about 450 mm disc for a 450 mm wafer, and so forth. In those instances where the wafer has a generally circular shape but has irregularities at the edge, e.g., notches or flat regions where wafer is cut to a chord, a disc-shaped HRVA can still be used, but other compensating adjustments, can be made to the system, which will be described in detail in a subsequent sections. In some embodiments, the HRVA has a diameter that is greater than the diameter of the wafer to be plated (e.g., greater than 200 mm, or 300 mm), and has an outer edge portion that is hole-free. Such edge portion can be used to create a small gap about the periphery of the wafer (a peripheral gap between the HRVA edge portion and a bottom of wafer-holding cup), and to assist in mounting the HRVA within the chamber, e.g., to an anode chamber wall. In some embodiments the size of the hole-free HRVA edge is between about 5 mm and about 50 mm from the outer edge of the HRVA to the edge of the portion of the HRVA that has holes. The top view of such HRVA is shown in FIG. 17, where, in this specific embodiment, the HRVA has a hole-free edge 151 around a hole-containing portion 119.

Figure 2A:
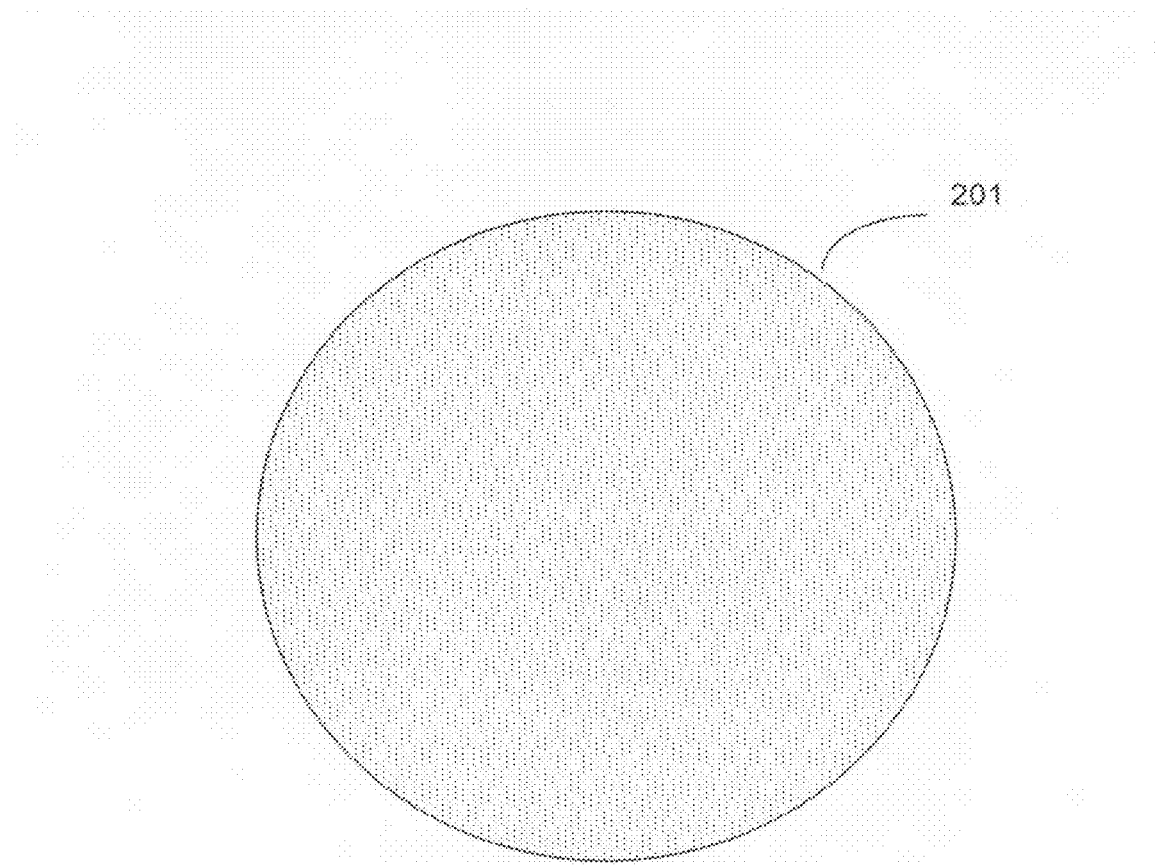
FIG. 2A is a schematic representation of a top view of an ionically resistive element having a plurality of 1 D through-holes, in accordance with embodiments presented herein.
Figure 2B:
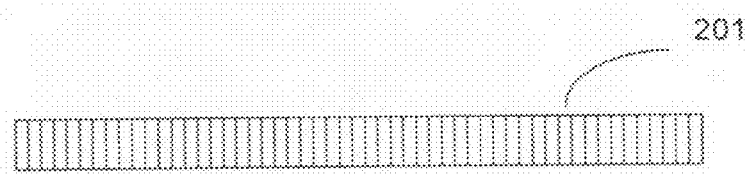
FIG. 2B is a schematic representation of a cross-sectional view of the ionically resistive element having a plurality of 1 D through-holes, in accordance with embodiments presented herein.

The number of through-holes made in the disk should be very large, but the diameter of each hole should be quite small. In one embodiment the number of holes ranges between about 6,000 and about 12,000, each hole (or at least 95% of holes) having a diameter (or other principal dimension) of less than about 5 mm. The schematic top view of HRVA plate 201 is shown in FIG. 2A illustrating top HRVA surface having a large number of small-diameter openings, shown as black dots. FIG. 2B illustrates a cross-sectional view of the HRVA disc 201, schematically illustrating non-communicating through-holes. In this embodiment the through-holes are substantially perpendicular to the top and bottom surfaces of the HRVA disc. The thickness of the HRVA disc ranges in some embodiments between about 5 mm and about 50 mm, e.g., between about 5 mm and about 25 mm. While HRVA shown in FIG. 2A, has a uniform distribution of through-holes, in other embodiments it is advantageous to use a HRVA having regions with non-uniform distribution of holes, or with holes that are blocked such that the wafer experiences non-uniform hole distribution.

It is important to note here that HRVA is distinct from so-called diffuser plates, whose main function is to distribute flow of electrolyte, rather than to provide significant electrical resistance. In contrast, HRVA significantly increases resistance of the plating system, as is needed for improving plating uniformity. Generally, resistive elements which increase system resistance by at least 0.45 ohm, or at least 0.6 ohm are preferred. The high resistance of provided element is achieved by providing an extremely large number of small through-holes, each having very small principal dimension (or diameter). For example, discs having between about 6,000-12,000 perforations, with each perforation having a diameter of less than about 5 mm, e.g., less than about 4 mm, less than about 3 mm, or less than about 1 mm are suitable resistive elements. The porosity value for suitable discs ranges typically from 1 to 5% (dependent on the number of through holes and their diameters). Such disks increase the resistance of the plating system by about 0.3 to 1.2 ohm, depending on the design and electrolyte conductivity. In contrast, diffuser plates typically have openings that constitute a much larger net porosity (in the 25 to 80 percent open void fraction), no more than is required to achieve substantially uniform electrolyte flow, and generally have a much smaller, often insignificant overall contribution to resistance of the plating system.

In one specific example, the ionically resistive ionically permeable element (HRVA) is a disc having about 9,000 perforations, each having a diameter of about 0.6 mm. The disc in this example has a diameter of about 300 mm (substantially coextensive with a 300 mm wafer) and a thickness of about 13 mm.

While HRVA (unlike a diffuser plate) should always have substantial resistivity, in some embodiments HRVA is configured such that it does not increase system resistance by more than 5 Ohms. This is because excessive resistance will require increased power to be used, leading to undesirable heating of the electroplating system.

Another important parameter of the resistive element is the ratio of a through-hole diameter (or other principal dimension) to the distance of the element from the wafer. It was discovered experimentally and subsequently verified by computer modeling that this ratio should be approximately 1 or less (e.g., less than 0.8, or less than 0.5). Preferably, in some embodiments this ratio is about 0.1 providing best plating uniformity performance. In other words, the diameter of the through-hole should be equal to or smaller than the distance from the resistive element to the wafer. In contrast, if the through-hole diameter is larger than the wafer-to-HRVA distance, the through-hole will leave its individual image or "footprint" on the plated layer above it, thereby leading to small scale non-uniformity in the plating. The hole diameter values recited above refer to the diameter of the through-hole opening measured on the HRVA face that is proximate to the wafer. In many embodiments, the through-hole diameter on both proximate and distal faces of HRVA is the same.

The distribution of current at the wafer (and, consequently, plating uniformity) can depend on a number of factors, such as the plating gap (HRVA plate to wafer distance), electrolyte flow rate, anode chamber design, plating solution properties, and uniformity of hole distribution on the HRVA. Particularly important is the distribution of through-holes at the center of the HRVA. Typically, the pores in a HRVA plate are designed to be of the same size and are distributed substantially uniformly. Such an arrangement can lead to a center spike or dip in the plated film thickness, or a corrugated (wavy) pattern.

Specifically, use of a HRVA having uniform distribution of holes in the center resulted in center spikes of about 200-300 Å for 1 µm plated layer.

In one of the embodiments, non-uniform distribution of 1-D pores/holes in the central region of the HRVA is employed to prevent the center spikes. The central region of HRVA is defined by a circular region at the HRVA center, typically within about 1 inch radius from the center of HRVA disk, or within about 15% of the wafer radius. The non-uniform distribution of through-holes effective for spike reduction can have a variety of arrangements achieved by shifting holes, adding new holes and/or blocking holes in an otherwise uniform pattern. Several non-uniform center hole patterns which are useful for avoiding plating non-uniformity will be illustrated.

The center spikes occur because smaller number of holes (located at the center of the HRVA) allows the central holes to have spatially larger time average exposure to the surface of the wafer (as compared to holes from larger population of holes located on the periphery of HRVA). The larger time average exposure influences the current in exposed areas of the wafer with a tendency to create an image of the time average exposure of the pattern of holes.

Figure 3A:
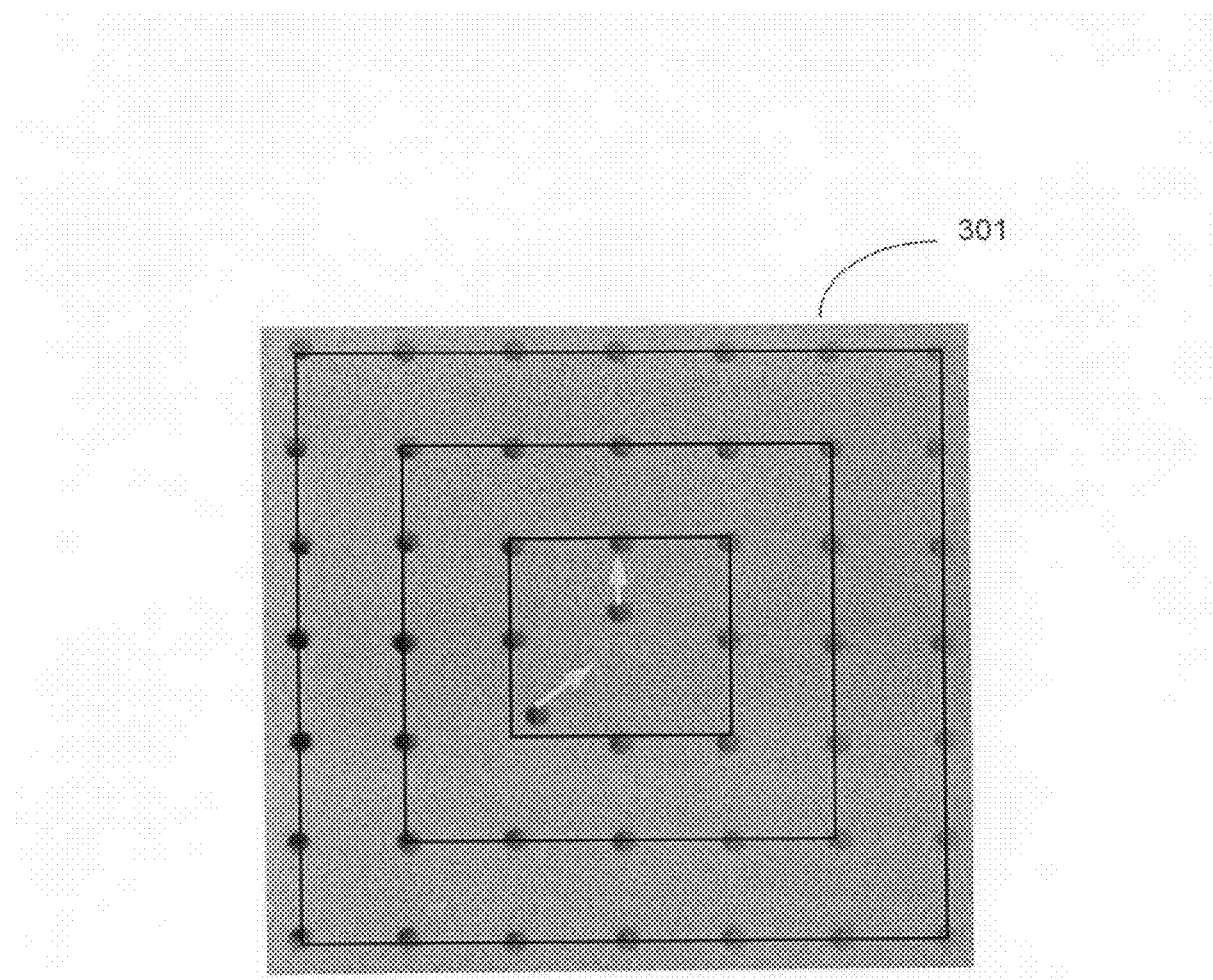
FIG. 3A is a photograph of an ionically resistive element having non-uniform distribution of through-holes in the center, in accordance with an embodiment provided herein.
Figure 3B:
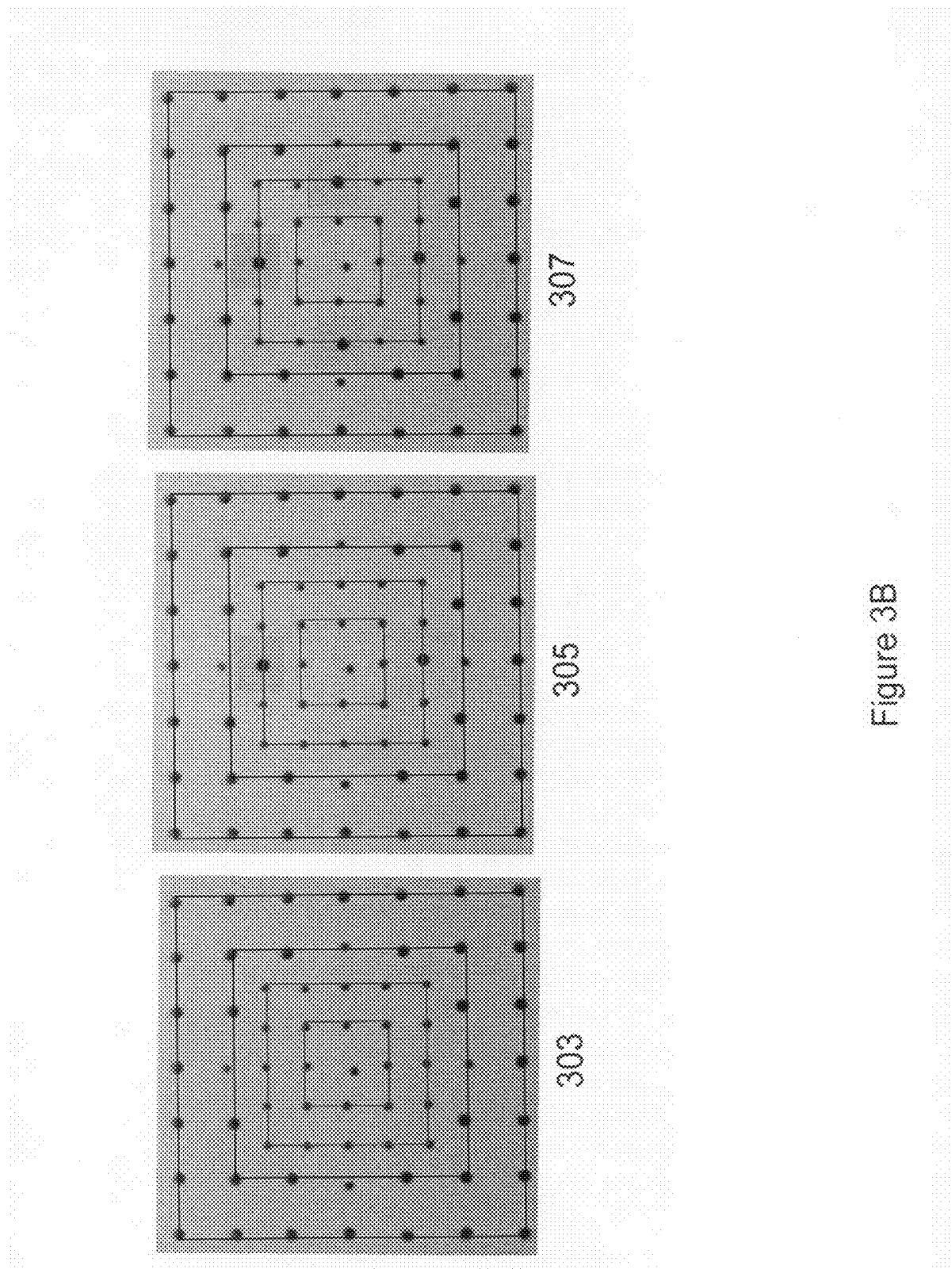
FIG. 3B shows three photographs of three different ionically resistive elements having non-uniform distribution of through-holes in the center, in accordance with embodiments provided herein.

A simple example of modification of a uniform square hole pattern is shown in FIG. 3A, which is a photograph of the central portion of the HRVA (top view). In this example, the hole at the very center of the HRVA plate is shifted away from the center, and one hole from the first non-center array hole set is shifted inward toward the center slightly, as compared to a regular square pattern. This non-uniform pattern is referred to as pattern 301. In FIG. 3B, examples of several other central hole pattern modifications, 303, 305, and 307 are shown. Modification of hole location, relative location and of distribution of holes having one or more sizes, can be used. For example, holes of different diameters may be used at the HRVA center. Further, some of the holes may be blocked as will be illustrated below.

Figure 3C:
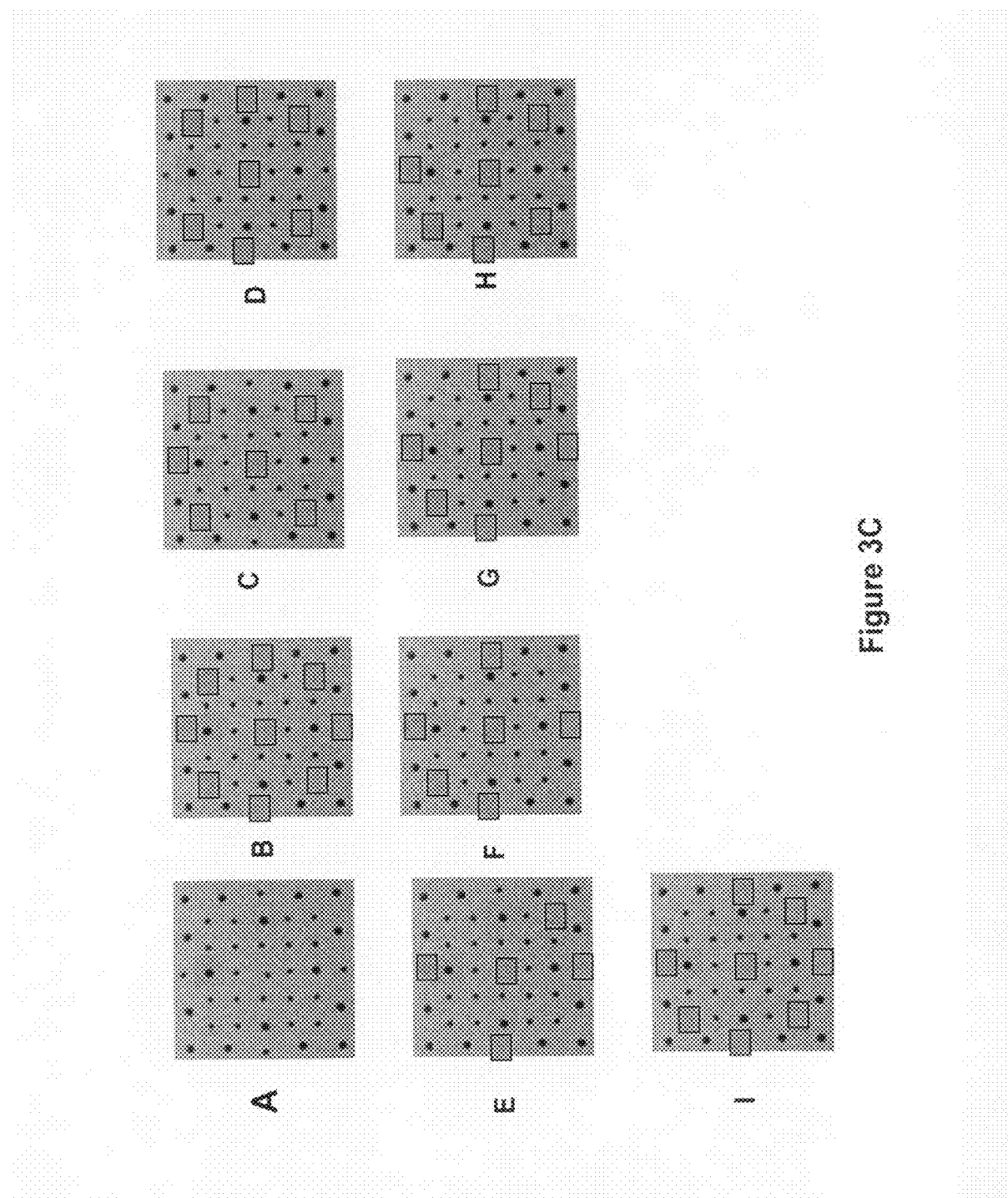
FIG. 3C shows representations of ionically resistive element 307, shown in FIG. 3B with different patterns of blocked through-holes.
Figure 3D:
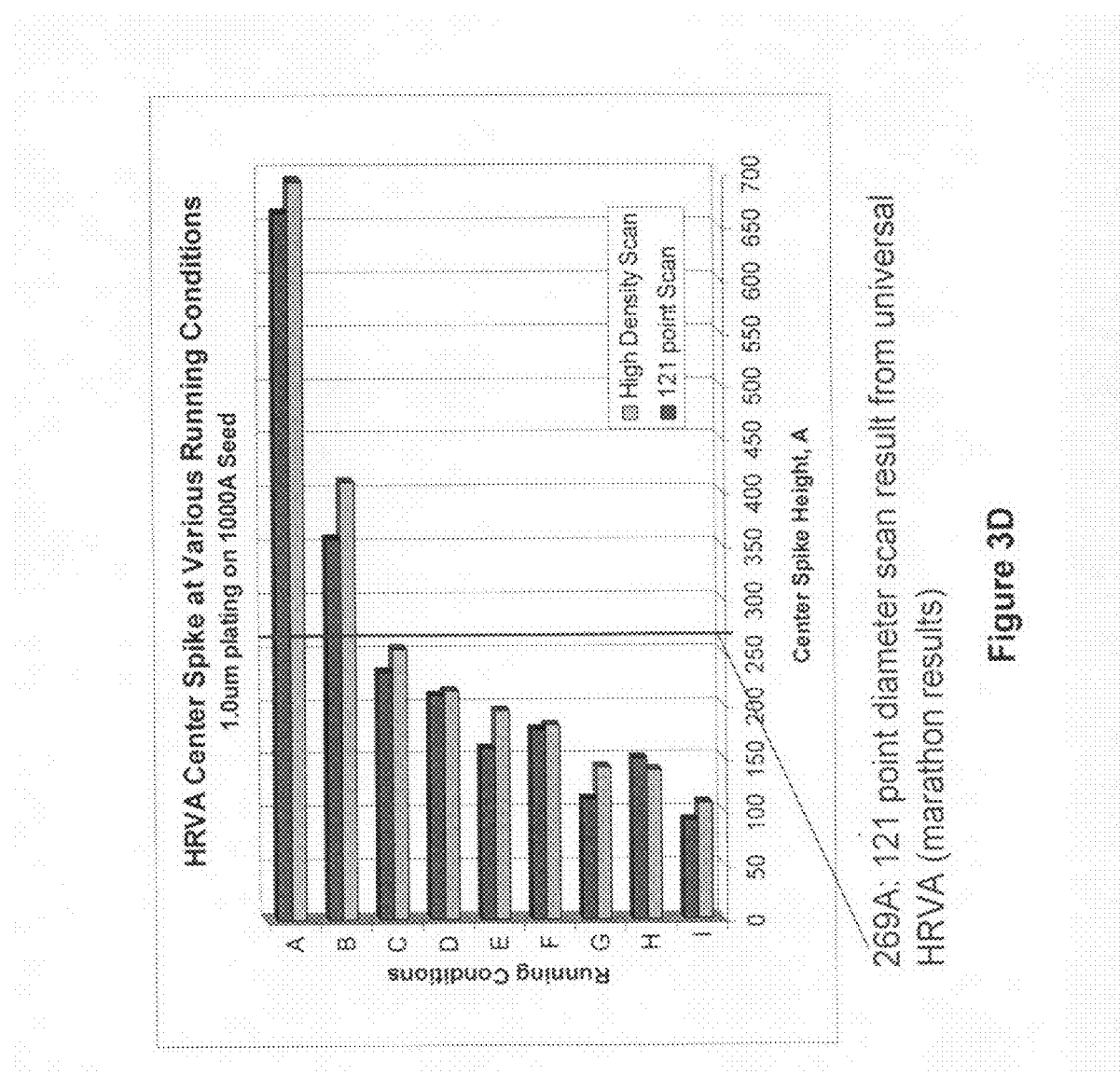
FIG. 3D shows a plot of center spike heights for different configurations of resistive element shown in FIG. 3C.

In FIG. 3C, nine different configurations of central portion of HRVA plate 307 are shown. Configuration A is identical to HRVA 307 shown in FIG. 3B and does not have any blocked holes. Configurations B-I illustrated in FIG. 3C, have different arrangements of blocked holes. Plating uniformity was measured for HRVAs A-I which were derived from original configuration 307. The results of these measurements are shown in FIG. 3D, where the height of center spikes in angstroms, is shown on the X-axis for different configurations A-I which are on the Y-axis. For plating on a 1000 Å seed layer, for the same bath, cell configuration and other parameters, HRVA with hole distribution 307 in configuration F exhibited the most uniform central plating. The exact optimal configuration will of course depend on the numerable influencing parameters, but optimization of the pattern procedure as demonstrated here can be used for other conditions, as will be understood by one of skill in the art.

Synergy between a resistive element and a thief cathode

Figure 4:
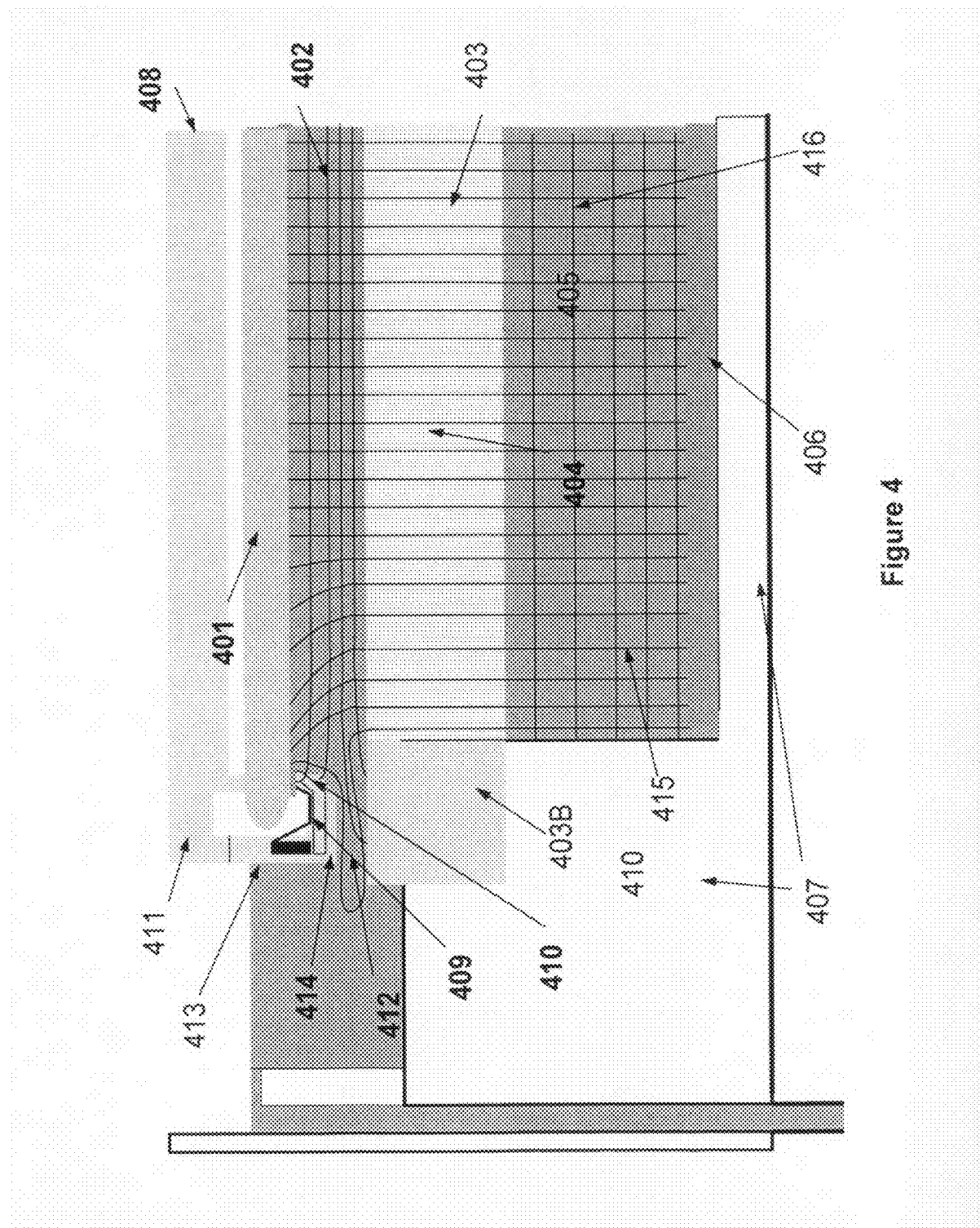
FIG. 4 is a cross-sectional schematic view of a plating cell (left half shown) equipped with a HRVA having 1D through-holes. Current and voltage lines are illustrated.

While in some embodiments the ionically resistive ionically permeable element is sufficient by itself for mitigating or eliminating the terminal effect, in other embodiments even with the use of the resistive element, edge-thick profiles can be obtained. This is particularly pronounced in those instances when seed layer resistance is greater than about 0.5 ohms cm. This can be understood using FIG. 4, which shows a schematic cross-sectional presentation of a portion (half) of electroplating apparatus with an illustration of current/voltage lines in the plating bath. In FIG. 4, 401 is a wafer having a conductive film (e.g. a copper seed layer) on the bottom surface. The seed layer is immersed into electrolyte and is negatively biased, such that it serves as a cathode onto which metal is plated. As mentioned previously, the electrical contacts to the seed layer are made only at the periphery of the wafer, with no contacts being made at the center. The wafer is positioned above a HRVA plate 403 having, in preferred embodiments, 1D through-holes 404, that allow current to travel from the anode 406 to the wafer 401. The HRVA is stationar in this embodiment, while the wafer is rotated during electroplating.

The anode 406 lies inside an anode chamber 407 below the wafer 401 and below the HRVA plate 403. The entire plating bath (from the anode 406 to the wafer 401) is filled with electrolyte. During plating, the ionic current passes from the anode, through the HRVA holes 404, and up through a small electrolyte-filled gap 402. Gap 402 is created by positioning the wafer (and wafer holder) over the HRVA plate. Fluid flows into the anode chamber below the HRVA through the HRVA holes, through the gap 402, and through the peripheral gap 412 created between the wafer/wafer holder and anode chamber 407/the edge of the HRVA 403B during normal operation. As it was mentioned, it is important that the gap 402 between the top HRVA surface and the plated wafer surface is kept minimal, e.g., less than about 10 mm, preferably less than about 5 mm.

In some embodiments, the wafer holder is a clamshell apparatus 408 which makes contacts to the periphery of the wafer through a number of contact fingers 409 housed behind a typically elastic "lip seal" 410, which serves to seal the clamshell and keep the edge contact region and wafer backside substantially free of electrolyte, as well as to avoid any plating onto the contacts 409. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes.

The clamshell is composed of two major pieces, the cone 411, which can open allowing for insertion and extraction of the wafer. The cone 411 also applies pressure to the contacts 409 and the seal 410. The second piece of the clamshell is the wafer holding cup 413. The bottom of the cup 414 typically needs to be made of (or coated with) an insulator to avoid any coupled corrosion and electrodeposition reaction which would occur, for example, on a metal that is placed into an electrolyte with a laterally varying potential as is the case here. However, at the same time the cup bottom needs to be mechanically strong. This is because it needs to be thin in order to avoid electrolyte flow disturbances near the wafer edge while being sufficiently strong to press the cup up against the wafer and cone while avoiding flexing. Therefore, in some embodiments the cup bottom is preferably metal that is coated with an insulating material such as glass or plastic.

For illustration purposes, FIG. 4 also schematically shows lines of current 415 (primarily vertical) and lines of constant potential (primarily horizontal) 416. As illustrated in FIG. 4, in the peripheral gap region 412, current lines diverge from their normal paths. The exposure (and/or proximity) of the near edge of the wafer to the gap 412 causes a high local current because the ionic resistance is smaller there than at the center of the wafer. This low resistance and higher current is due to opportunity and ability of the current to flow via a larger number of flow paths. Because of addition of these more circuitous routes where current flows not just directly between the HRVA and the wafer, but also radially outward in the peripheral gap 412, and then up and back into the wafer edge, the net resistance for current flow at the very near edge is reduced and current density is accentuated there. Therefore, in some embodiments, this problem is addressed by providing a second "thieving" cathode (referred to also as the "second" or "dual" cathode) which can divert a portion of ionic current from the wafer out of the edge gap thereby improving uniformity of current density experienced by the wafer.

Significantly, the use of the thieving cathode in combination with 1D porous HRVA positioned in close proximity of the wafer, is particularly advantageous because of the synergistic interplay between the two elements, accentuated by the small HRVA-to-wafer, and by one-dimensional flow of current in the body of the HRVA. In some embodiments, the synergy is further enhanced due to an extended peripheral gap extending radially outward from the wafer edge. This extended peripheral gap 412 is between the insulating HRVA edge 403B or wall of anode chamber 407 and the insulating cup bottom 414.

Figure 5A:
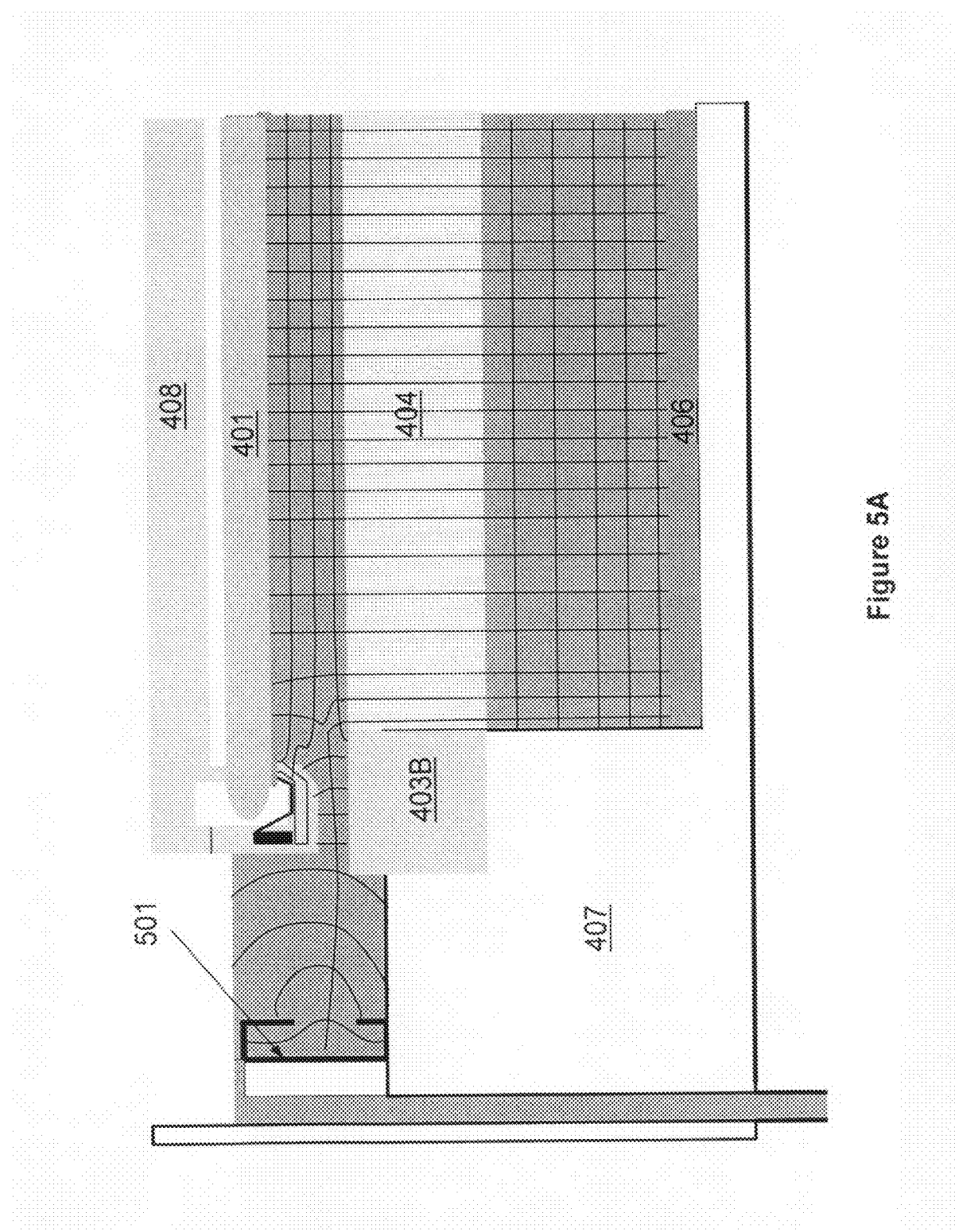
FIG. 5A is a cross-sectional schematic view of a plating cell (left half shown) equipped with a HRVA having 1D through-holes and a thief electrode. Current and voltage lines are illustrated.

FIG. 5A is similar in layout to FIG. 4, but incorporates the thieving cathode 501 located outside of the HRVA-to-wafer gap 402 and outside of the peripheral gap 412. FIG. 5A illustrates that when the thieving cathode 501 is energized (polarized and drawing current), current lines that emanate from the gap region which might otherwise be directed towards the wafer near edge, are diverted to the thieving cathode 501. Such current distribution results in more uniform plating at the wafer edge.

Figure 5B:
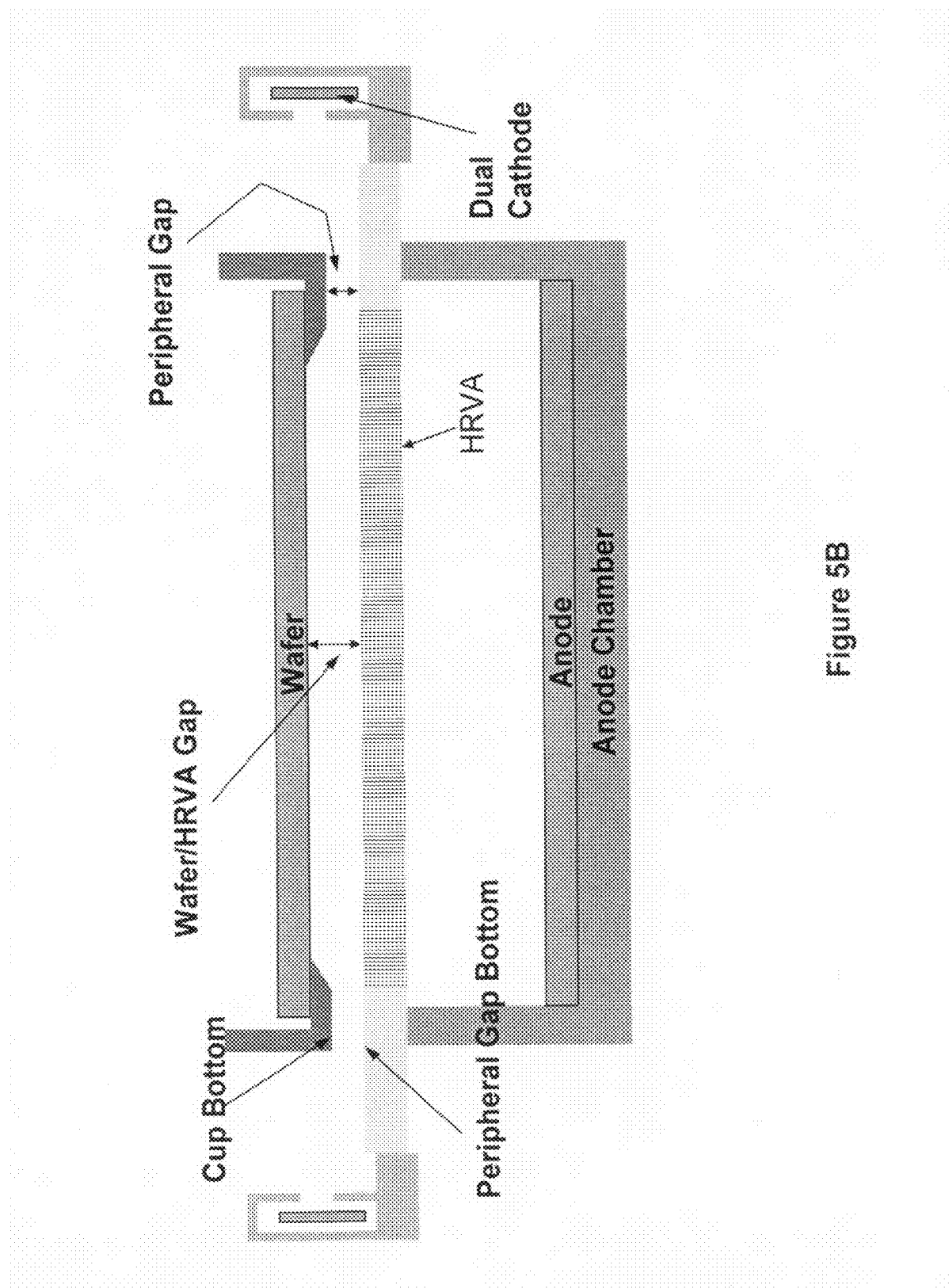
FIG. 5B is a cross-sectional schematic view of a plating cell equipped with a HRVA where the peripheral gap is smaller than a wafer-to-HRVA gap.
Figure 5C:
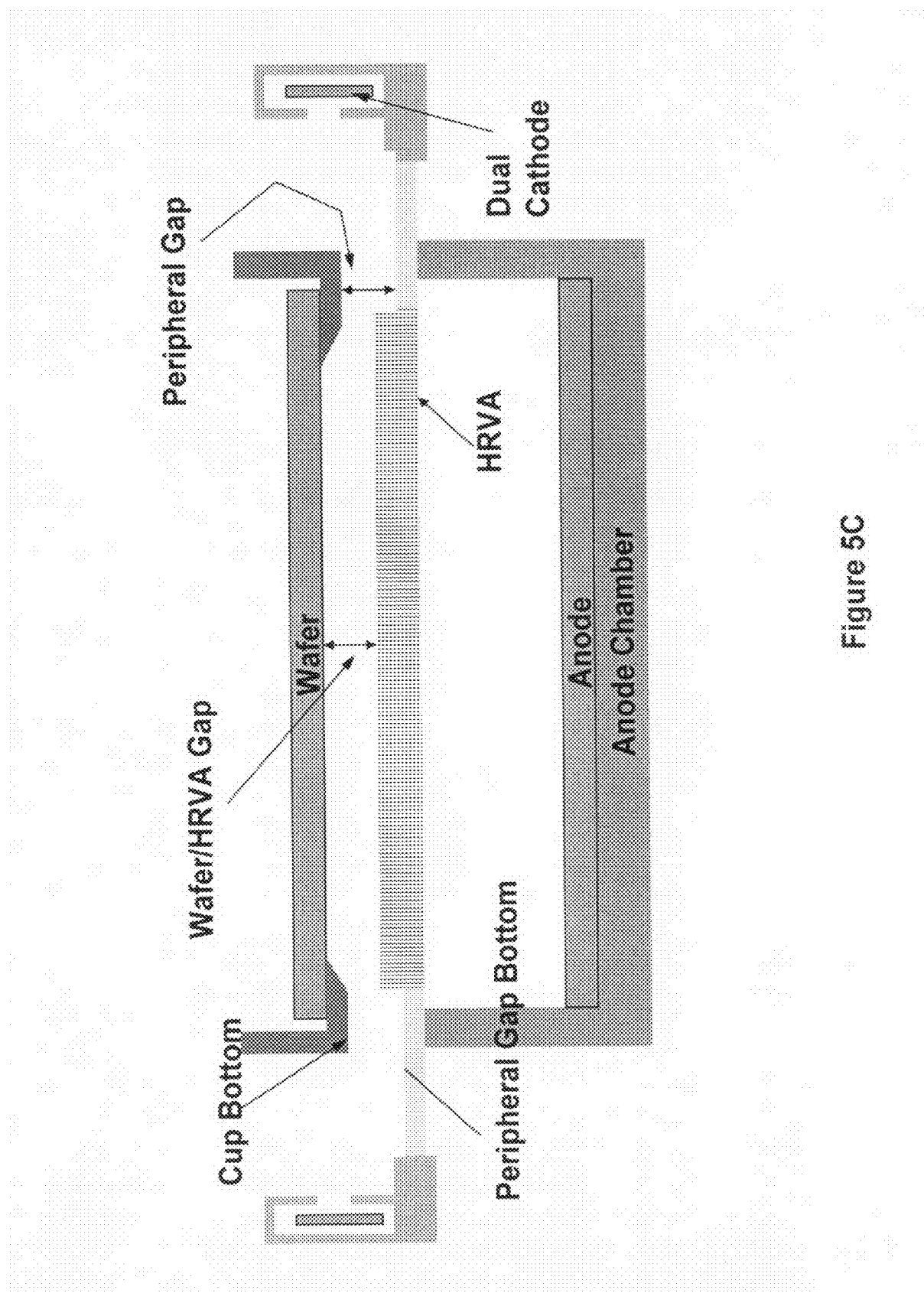
FIG. 5C is a cross-sectional schematic view of a plating cell equipped with a HRVA where the peripheral gap is larger than the wafer-to-HRVA gap.
Figure 5D:
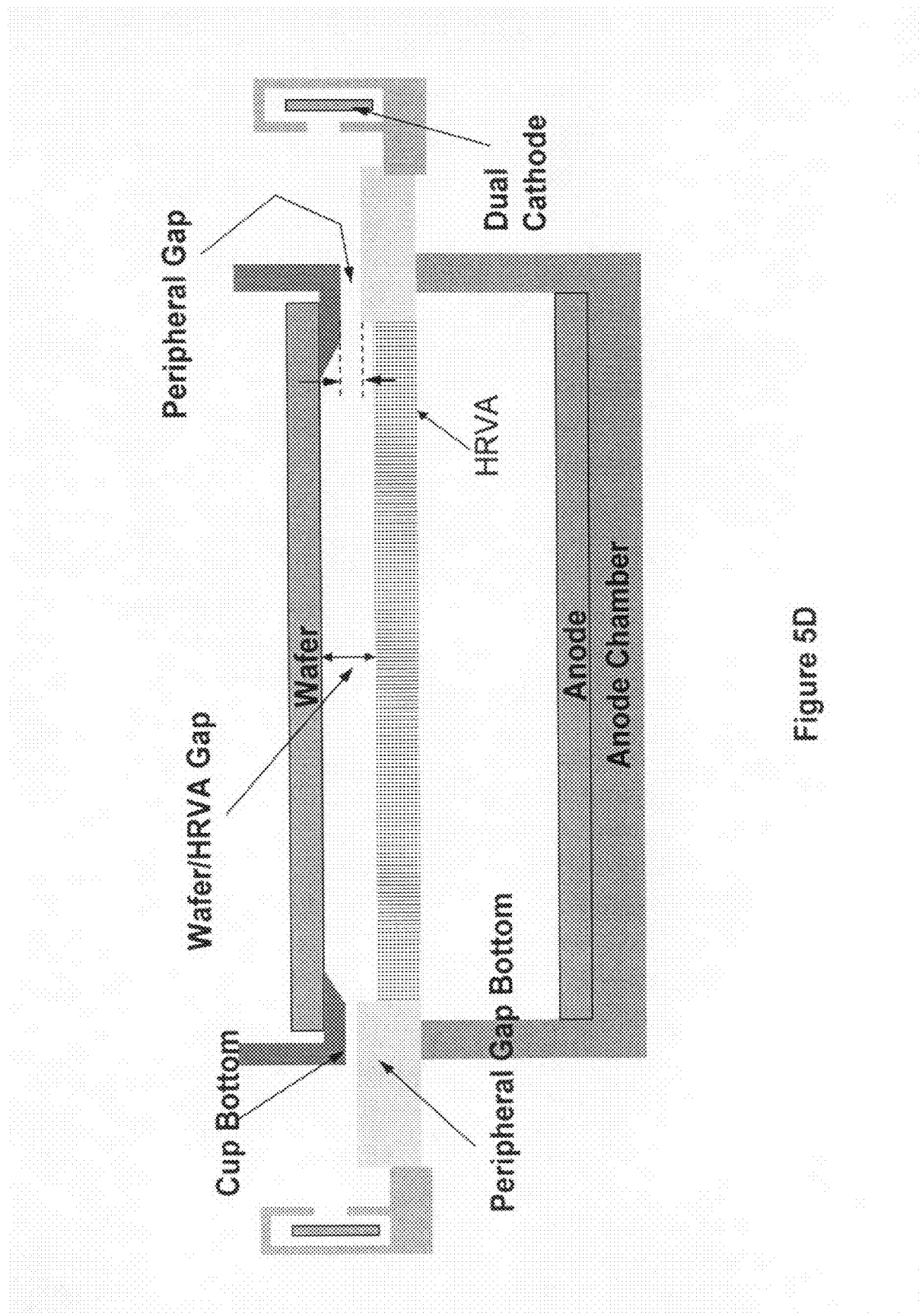
FIG. 5D is a cross-sectional schematic view of a plating cell equipped with a HRVA where the peripheral gap is smaller than the wafer-to-HRVA gap.

FIGS. 5B, 5C, and 5D illustrate several embodiments having different peripheral gaps but the same wafer-to-HRVA gap. The peripheral gap is formed by the insulating members located at the periphery of the wafer (e.g., around wafer edge). Specifically, in some embodiments the top portion of peripheral gap is formed by the insulating bottom of the wafer-holding cup while the bottom portion of the peripheral gap is formed by an upper wall of the anode chamber. In other embodiments the bottom portion of the peripheral gap is formed by a hole-free edge region of HRVA, or both by hole-free HRVA edge and an anode chamber wall. The height of peripheral gap is the distance between its top and bottom portions as illustrated in FIGS. 5A, 5B, and 5C. In many embodiments the height of the peripheral gap (i.e. "peripheral gap") is slightly smaller (e.g., about 2-3 mm smaller) than the HRVA-to-wafer gap. FIG. 5B illustrates an embodiment, in which the peripheral gap is smaller than the HRVA-to-wafer gap, because the wafer cup located at the periphery of the wafer extends downward with respect to the plane of the wafer thereby narrowing the peripheral gap at the periphery of the wafer. FIG. 5D shows another embodiment in which the peripheral gap is smaller than the wafer-to-HRVA gap. In this case the bottom portion of the peripheral gap (e.g., hole-free portion of HRVA and/or anode chamber wall) is extended upward and resides at a higher level than the hole-containing portion of the HRVA. In other embodiments, such as one illustrated in FIG. 5C, the peripheral gap is slightly larger than the wafer-to-HRVA gap. For example, in this case the bottom portion of the peripheral gap may reside at a lower level as compared to the level of the hole-containing portion of the HRVA. In many embodiments the peripheral gap is the same as the HRVA-to-wafer gap ±2 mm.

The interplay between small HRVA-wafer gap 402 (preferably, 10 mm or less, more preferably 5 mm or less, e.g., 3 mm or less from wafer plating surface to HRVA surface proximate the wafer), and the second cathode 501 is very important for the functionality of the system. If this gap were larger, the performance of the HRVA in directing current to the center would be diminished, and the extraction of current from the very near edge via the secondary cathode would be hindered. This can be seen by referring to FIG. 6, which shows computer simulations of the near edge current density distribution with different peripheral gaps with and without an energized second cathode.

FIG. 6 illustrates that with smaller gap, the second cathode becomes more effective in "sucking out" current from the near edge region. Curve (a) shows current density distribution at wafer edge for an apparatus with the peripheral gap of 1 mm with no thief current. Curve (b) shows current density distribution for an apparatus with the peripheral gap of 1 mm, with energized thief cathode at 1V. Curves (c) and (d) show current density distributions for apparatuses having the peripheral gaps of 3 mm, without a thief and with the thief energized at 1V. The current density is shown on the y-axis. Radial position on the wafer edge in millimeters is shown on the x-axis. When the thief is turned off, the excess gap-induced current is slightly larger and penetrates slightly further (1 mm) inwards for an apparatus with a 3 mm gap vs. the apparatus with a 1 mm gap. However, the distance where the current deviates from the central value by about 5% is nearly identical for both curves (a) and (c). However, when the thief is turned on (and in this example, set to 1V cathodic of the wafer potential) the distance where the current density divergence of 5% occurs is several mm closer to the edge of the wafer in an apparatus having the smaller 1 mm gap (curve (b)) as compared with the apparatus having the larger 3 mm gap (curve (d)). Since the area at the edge of the wafer and the number of wafer dice are greatest here, this has a major impact on process robustness and yield. Specifically, because the gap between the wafer and the resistive element in preferred embodiments is extremely small, the thieving cathode is able to direct its extraction and limit its extraction to "suck" the excess current only from the very near edge significantly more efficiently as compared to a case where an apparatus with a large gap is used (where the current has an opportunity to redistribute). Importantly, if the HRVA (most specifically a one dimensionally conductive HRVA) weren't present, current that would be otherwise destined to the wafer coming from more centrally locations of the anode, has an opportunity to be diverted from the center.

There are two key relationships which help determine the distance/area requiring edge terminal current correction: the ratio of the size of the gap to the extent (thickness) that the cup bottom lies below the wafer and the shape of the cup bottom (angle). Due to hydrodynamic interactions and to avoid trapping bubbles at the wafer edge, the edge angle must be sharp (near parallel as possible). Therefore, with this constraint, the primary parameter is the gap. In addition, due to the extremely small gap between the resistive element and the wafer, the actual position of the second cathode becomes relatively unimportant. This insensitivity is increased as the length of the peripheral gap extending radially outward from the wafer edge is increased, typically reaching insensitivity at a radial extention distance of about 4-5 times the wafer-to-HRVA gap. Then, regardless of the position of the second cathode or the length of the peripheral gap extension beyond the wafer, the current will be "sucked" through the small peripheral gap at the wafer edge.

Therefore, the second cathode can be positioned radially outward of the wafer either above, below or at the same level with the wafer, within the plating chamber or on the outside of the plating chamber, as long as there is an ionic communication between the thieving cathode and the wafer surface. For example, the second cathode can be positioned in a separate chamber on the outside of the main plating chamber, and peripheral to the plating chamber, where ionic communication exists between the two chambers through, e.g., open windows, or windows covered with an ionically permeable membrane. The second cathode can have a variety of shapes (e.g., a ring, a C-shape, a series of individually activated electrodes at different azimuthal positions, or even a rod).

One of the advantages of employing a thieving cathode is that the level of current applied to the cathode can be dynamically controlled during plating to account for plating non-uniformity. For example, the level of current applied to the second cathode can start at high level when the metal layer is thin, and then can be gradually or incrementally reduced during plating, as the thickness of the plated layer increases and the severity of the terminal effect subsides.

Segmented Second Cathode

In some embodiments, the second thieving cathode includes several segments, where each of the segments can be separately powered by a separate power supply or using one power supply having multiple channels adapted to independently power segments of the second cathode.

Such segmented second cathode is particularly useful for plating on non-circular or asymmetrical wafers, such as wafers having flat regions. In general, however, segmented second cathode having independently powered segments, can be used with any kind of workpiece (symmetrical or not) as it allows fine-tuning plating uniformity. Specifically, segmented second cathode can be used for providing current corrections at different azimuthal positions of the wafer.

Figure 7A:
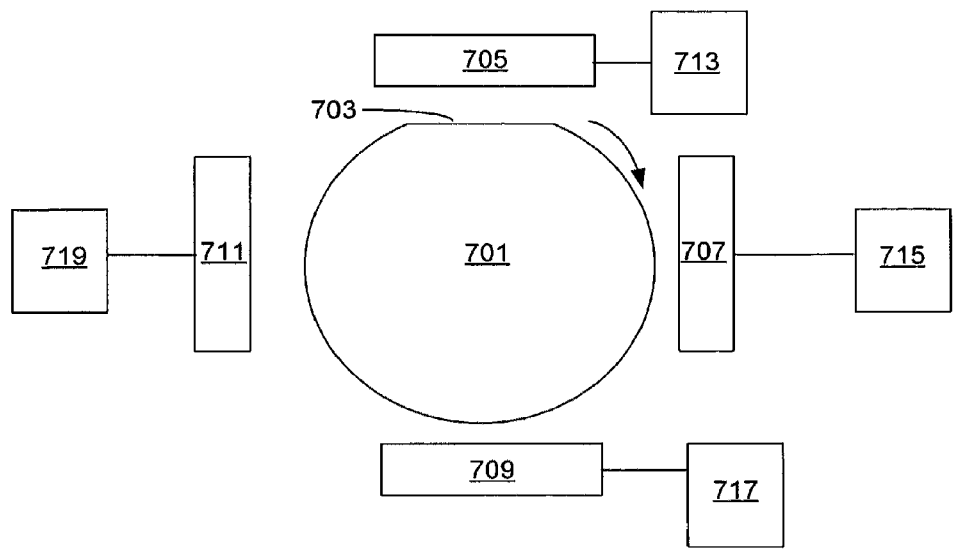
FIGS. 7A and 7B illustrate a schematic top view of a rotating wafer having a wafer flat region, where the plating uniformity is controlled using a segmented second cathode, where the segments are powered in correlation with wafer rotation.
Figure 7B:
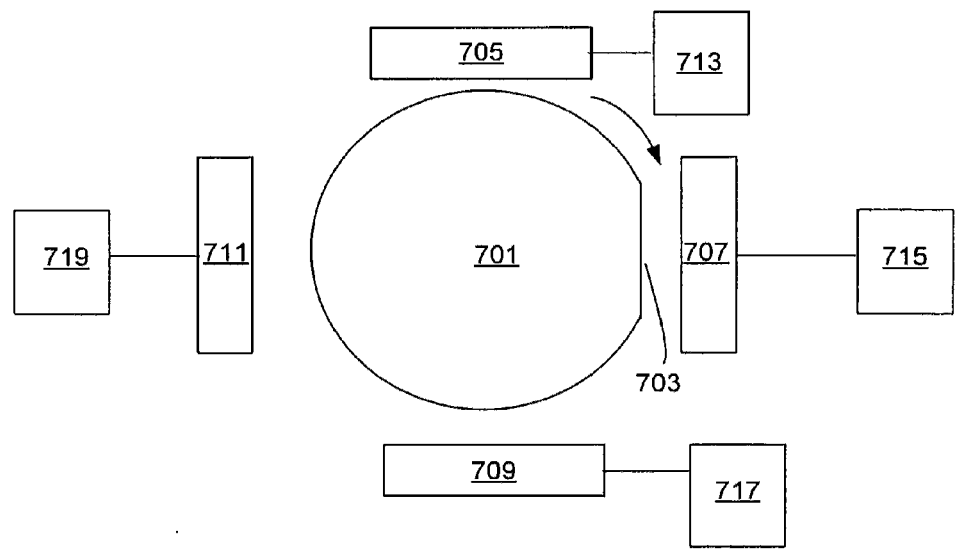

This concept is illustrated in FIGS. 7A and 7B which show a schematic view of a wafer 701 having a wafer flat region 703, where the circular wafer is cut to a chord. Peripheral to the wafer are located four thief cathode segments, 705, 707, 709, and 711, each electrically connected to its own power supply 713, 715, 717, and 719. Understandably, one power supply with a plurality of channels can also be used. The thief electrode segments are located at different azimuthal positions with respect to the wafer. The segment 705 is aligned with a wafer flat region and resides at 0° azimuth. Segments 707, 709, and 711 reside at 90°, 180°, and 270° azimuthal positions respectively. As the wafer 701 rotates in the clockwise direction, the wafer flat region 703 becomes aligned consecutively with the segment 707, then with segment 709, with segment 711, and then again with segment 705. FIG. 7B shows the same system as shown in FIG. 7A, with the wafer rotated by 90° such that the wafer flat 703 is aligned with the thief segment 707.

Because current density at the wafer flat region will be different than the current density at the circular regions of the wafer, a different amount of current needs to be diverted from the wafer flat part as compared from the other parts. Accordingly, in one embodiment, the thief cathode segments are powered in concert with wafer rotation, such that a first level of current is supplied to the segments aligned with the wafer flat region, while a second level of current is supplied to the thief segments aligned with the circular portions of the wafer.

For example, in a position shown in FIG. 7A, a first level of current, X, is supplied to the segment 705 aligned with the wafer flat 703, while a second (different) level of current, Y, is supplied to each of the segments 707, 709, and 711. As the wafer rotates 90° to a position shown in FIG. 7B, the first level of current, X, will be supplied to the segment 707, now aligned with wafer flat 703, while the second level of current Y, is supplied to the segments 709, 711, and 705. By alternating the current supplied to the thief cathode segments in accordance with wafer rotation, a correction for plating non-uniformity at circular and flat regions of the wafer is properly made. A controller connected to the power supplies and containing program instructions for correlating the power levels supplied to thief segments with wafer rotation speed, can be used to orchestrate the process.

It is understood that the presentation shown in FIGS. 7A and 7B is schematic only. The thief segments can be located below, at the same level, or above the wafer, either in the same plating chamber as the wafer or in a different plating chamber in ionic communication with the main plating chamber. Any arrangement of the segments can be used, as long as the segments are aligned with different azimuthal positions about the wafer.

The number of segments can vary depending on the needs of the process. In some embodiments between about 2-10 segments are used.

While the multi-segmented thief cathode is particularly useful with a 1-D HRVA disposed in close proximity of the wafer, as was described above, this is a separate embodiment which can be used both independently and in combination with various plating apparatus features disclosed herein (e.g., HRVA, potential-controlled wafer entry, etc.).

Rotating HRVA Having Non-Uniform Distribution of 1D Through-Holes

In a separate embodiment, the plating uniformity on unsymmetrical wafers, can be adjusted by using a rotating unsymmetrical HRVA. The unsymmetrical HRVA can have a portion that has a different hole distribution pattern from the main portion, or a portion that is cut off, or a portion without holes altogether. The rotating HRVA is aligned with the rotating wafer such that a distinct portions of the wafer are aligned with distinct portions of the HRVA. For example, a wafer having a wafer flat region can be rotated at the same speed as the rotating HRVA such that a region of HRVA having a non-uniform hole distribution is aligned with the wafer flat region during rotation.

Figure 8A:
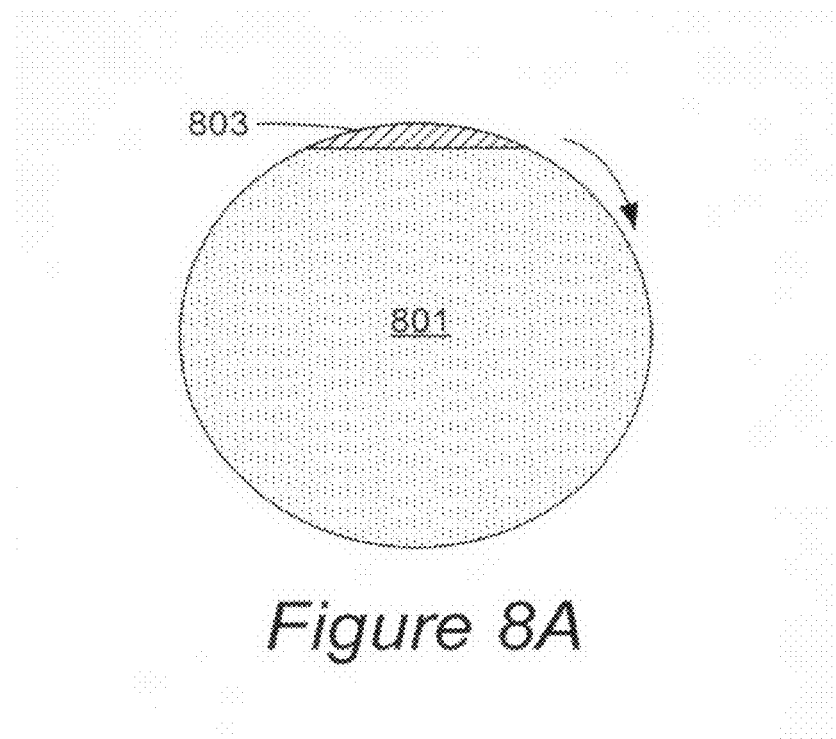
FIGS. 8A and 8B illustrate a schematic top view of a rotating HRVA having a non-uniform region adapted for use with non-circular wafers (wafers having wafer flats, cuts or other features).
Figure 8B:
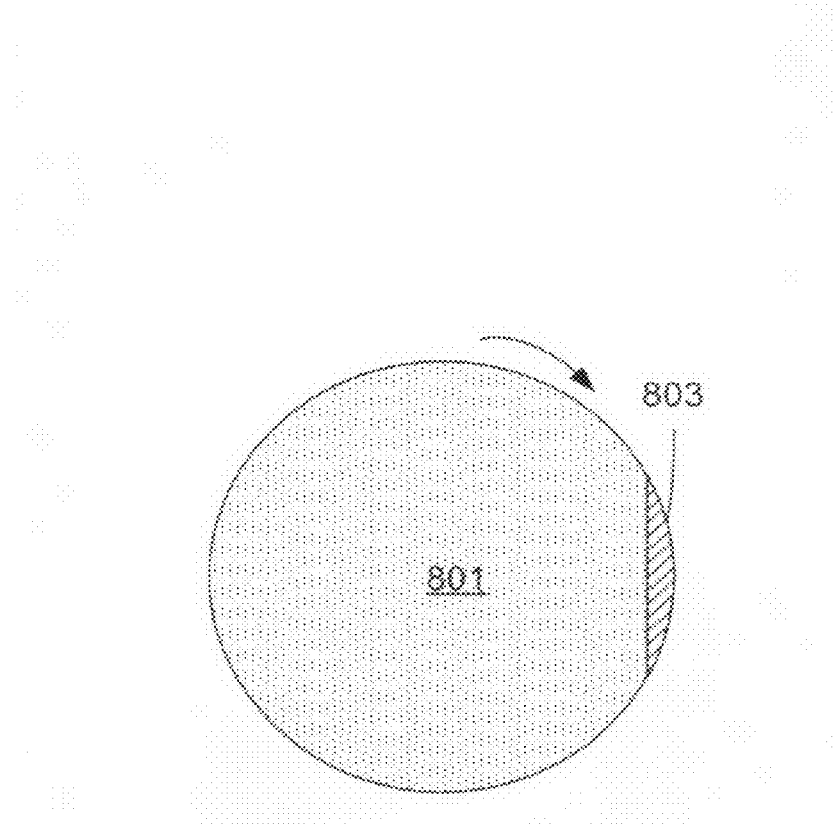

FIGS. 8A and 8B show a top view of a rotating HRVA 801 having a region 803, where distribution of holes is different from the rest of the HRVA. In some embodiments the region 803 may be absent (cut off to a chord) or it can be solid without holes. In some embodiments (not illustrated) the region with non-uniform distribution of holes is wedge-shaped or is azimuthally asymmetric. The rotation of the HRVA is aligned with the rotation of the wafer (not shown), such that the region 803 is aligned with the wafer flat, as the wafer rotates. FIG. 8B shows HRVA having nonuniform region 803 upon rotation to 90°. A controller which includes program instructions for synchronizing wafer rotation and HRVA rotation will be connected with the HRVA and the wafer in some embodiments.

This embodiment can be used separately or in combination with the thief cathode and other features disclosed herein. In some embodiments using rotating unsymmetrical HRVA, the HRVA does not need to be positioned in close proximity of the wafer.

Stationary HRVA with a rotating shield compensating for non-circular wafer In yet another separate embodiment the plating uniformity control for a non-circular wafer is achieved by using a rotating shield positioned above or below the HRVA. The shield is configured to eclipse the HRVA holes and is shaped such as to compensate for non-uniformity of current density distribution at non-circular regions of the wafer (e.g., wafer flat). The shield is aligned with the wafer flat and rotates at the same speed as the wafer, providing a continuous adjustment to current density experienced by the wafer flat region. The shield can have a variety of shapes, such as a wedge shape, a gingko leaf shape, a bat-wing shape, etc. The synchronization of the shield and wafer rotating speeds can be done using a controller having program instructions for synchronization.

This embodiment can be practiced separately or in combination with the thief cathode and/or with potential-controlled entry described herein.

Potential-Controlled Wafer Entry

In some embodiments, it was found advantageous to use potential-controlled wafer entry process in combination with one or more methods for reducing terminal effect which were described herein. For example, in some embodiments, potential-controlled wafer entry is performed in an apparatus equipped with a HRVA having 1D through-holes, or in an apparatus equipped with both HRVA and a thieving cathode configured to divert a portion of ionic current from the edge of the wafer.

In potential-controlled wafer entry, the potential between the wafer and the reference electrode is controlled (e.g., kept constant) while the wafer is immersed into electrolyte. Potential-controlled entry is a preferred wafer entry process in many embodiments, because it helps avoid seed layer corrosion (due to low current density at the wafer) or wafer burning (due to excessive current density). Unlike cold wafer entry, where the wafer is not energized until fully immersed, and unlike hot galvanostatic wafer entry, where total current is kept constant during wafer entry, the potential-controlled wafer entry allows for gradual current increase with an increase of wetted surface area occurring during wafer immersion.

The potential-controlled wafer entry requires a reference electrode immersed into electrolyte in the proximity of the wafer, and, in some embodiments, but not necessarily, makes use of a sense lead "finger" positioned at the wafer surface. The set-up for potential-controlled electroplating is described in detail in U.S. Pat. No. 6,551,483 titled "METHOD FOR POTENTIAL CONTROLLED ELECTROPLATING OF FINE PATTERNS ON SEMICONDUCTOR WAFERS" by Mayer et al., issued on Apr. 22, 2003, which is herein incorporated by reference in its entirety and for all purposes.

In some embodiments the potential-controlled wafer entry is performed while the wafer is immersed into the plating bath at an angle to the plane of electrolyte. The immersion of tilted wafer is advantageous for it decreases entrapment of bubbles. A number of apparatus set-ups and methods for immersing a tilted wafer are described in the U.S. Pat. No. 7,097,410 titled "METHODS AND APPARATUS FOR CONTROLLED-ANGLE WAFER POSITIONING" by Reid et al, issued on Aug. 29, 2006, which is herein incorporated by reference in its entirety and for all purposes. In some embodiments the tilt angle of 5 degrees or less is preferred. In other embodiments the tilt angle may be as high as 90 degrees.

Figure 9:
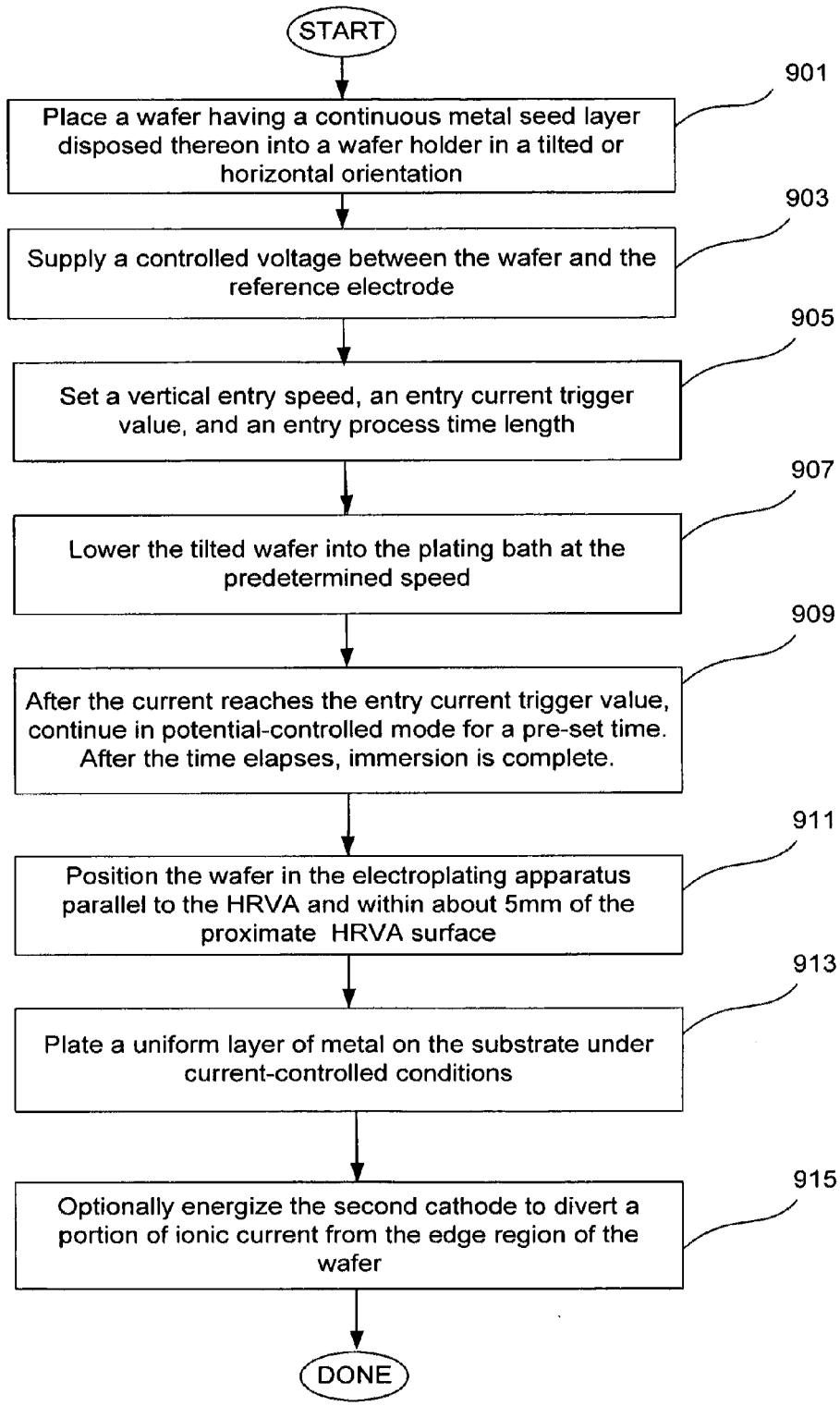
FIG. 9 is a process flow diagram for electroplating using potential-controlled wafer entry in accordance with an embodiment of the invention.

An example of an electroplating method which employs potential-controlled wafer entry in an apparatus equipped with a HRVA and a thieving cathode is illustrated in the process flow diagram of FIG. 9.

The process starts in 901 by placing the wafer into a wafer holder outside of the plating bath. The wafer can be placed in a horizontal or in a tilted orientation with respect to the plane of electrolyte in the bath. If it is placed in horizontal orientation it can later be tilted as its being lowered towards the electrolyte. Next, in 903, a controlled voltage is supplied between the wafer and a reference electrode immersed into electrolyte in the proximity of the wafer. Notably, the power supply biases the wafer with respect to the anode, but no current is supplied to the reference electrode which is used for potential measurement. In some embodiments, controlled potential between the wafer and the electrode is constant, in other embodiments it can be varied in controllable pre-determined fashion. In some embodiments the potential is kept at a constant value from the range of from about 0.35 V to about 1.4 V In the next operation 905 (which generally can also occur earlier in the process), a number of parameters for potential-controlled entry are set. The user can define a vertical entry speed, which is a speed at which the wafer is lowered into the bath. In some embodiments, speeds from about 50 to about 200 mm/second at wafer tilt angles of about 1-5 degrees are used. The user can also set a suitable current trigger value and a desired length of entry process. The current trigger level is the level of current, upon reaching which the entry process timer is started. For example, after current reaches a pre-set trigger value from the range of about 0.5 to 5 amperes, the timer starts counting a pre-set entry length, which is selected from the range of between about 75 and 300 milliseconds, in some embodiments.

Next, in operation 907 the tilted wafer secured in the wafer holder is lowered into the plating bath at a predetermined speed. In some embodiments the wafer is also rotated while it is being lowered and immersed into electrolyte.

The tilted energized wafer enters into electrolyte with a leading wafer edge (closest to electrolyte), and the wetted area of the wafer is increased as the wafer is getting immersed. This results in current increase.

As shown in operation 909, after the current reaches the pre-set current trigger value, the timer for entry process is started. The potential-controlled entry proceeds for the pre-set entry time. After this time elapses, immersion is considered complete.

As shown in operation 911, the wafer is placed horizontally (the tilt is eliminated during or after immersion) and parallel to HRVA, preferably within about 5 mm of HRVA, where the distance refers to the distance between the bottom wafer surface immersed in electrolyte and the proximate HRVA surface.

After the immersion of wafer is complete, the process is switched from potential-controlled entry to current-controlled plating. As shown in operation 913 the process proceeds by plating a uniform layer of metal on the substrate under current-controlled (e.g., constant-current galvanostatic conditions). In some embodiments current-controlled plating is started at a lower current level, which proceeds for an period of time until high aspect ratio features are filled with metal. The process then proceeds at a significantly higher current to fill lower aspect ratio features and, in some embodiments, to form a uniform overburden suitable for subsequent planarization operation (e.g., chemical mechanical polishing (CMP)).

In some embodiments, as shown in operation 915, the second cathode circuit is energized after transition to current-controlled plating is complete, to divert current that might otherwise be directed to the wafer edge and to aid in achieving a more uniform plating current distribution.

Figure 10:
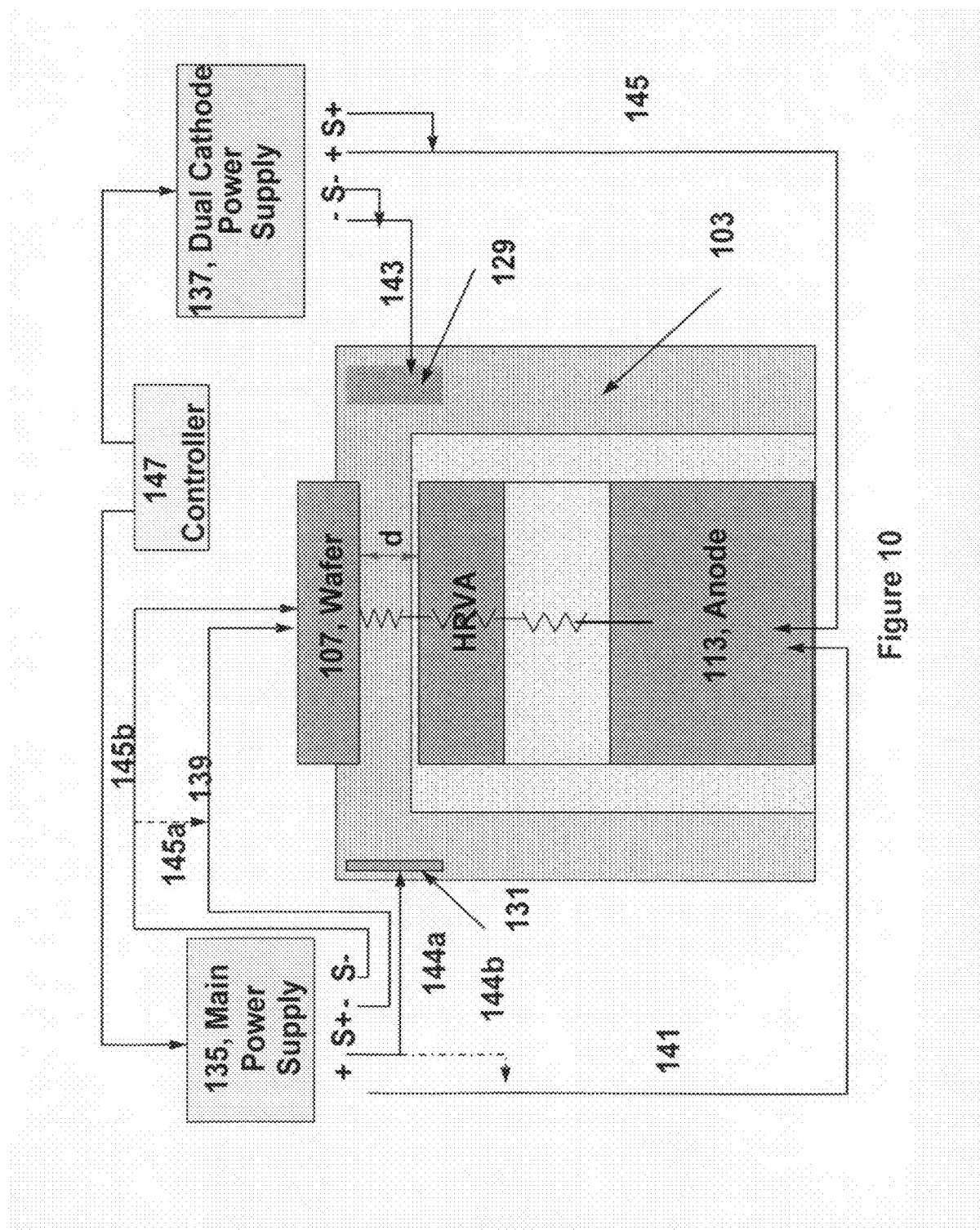
FIG. 10 is a schematic illustration of electrical circuits in a plating system adapted for potential-controlled wafer entry, where the system includes a reference electrode and a sense lead at the wafer surface.

The simple schematic of an electrical circuit, suitable for an electroplating apparatus configured for performing potential-controlled entry, current-controlled bulk plating, and use of second cathode is shown in FIG. 10.

The plating bath is filled with electrolyte and houses an anode, 113, a HRVA 119 disposed above the anode, a reference electrode 131 positioned on the periphery of HRVA and above it, and a second cathode 143 also positioned on the periphery of HRVA. The wafer 107 is disposed directly above the HRVA with its bottom surface immersed into electrolyte. A very small electrolyte-filled gap d (preferably 5 mm or less) exists between HRVA and the wafer. The system contains two power supplies, a main power supply 135, and a second cathode power supply 137. Both power supplies are connected to a controller, which is configured to control parameters of potential-controlled entry, current-controlled plating, and current levels supplied to the second cathode.

The main power supply 135 has a negative lead connected to the wafer 107 via line 139, and a positive lead connected to the anode, 113 via line 141. The positive sense lead of the main power supply is connected to the reference electrode 131 via line 144a. In contrast, when reference electrode is not employed the positive sense line is connected to power line 141 via 144b (shown in dotted lines). The negative sense line of the main power supply 145b in some embodiments is connected to the sense finger contacting the wafer. In other embodiments, the sense finger is not used, and this sense line is connected to the power line 139 via line 145a (shown in dotted line). For a configuration allowing potential-controlled entry, a reference electrode immersed in electrolyte and connected via sense line to the main power supply und subsequently to the system controller, is desired. The presence of a sense finger in contact with the wafer connected via sense lead to the main power supply is advantageous in some embodiments, but is generally optional.

The second cathode circuit can be essentially identical in configurations with and without reference electrode. The second cathode power supply has its negative lead connected to the second cathode 129 via power line 143 and a negative lead connected to the anode 113 via power line 145. The sense lines from the second power supply are connected to the corresponding power lines.

As it was mentioned both power supplies are connected to the controller 147 which is configured to control parameters of the plating process, such as power levels supplied by each power supply, timing for switching on the second cathode, potential-controlled entry process, etc.

Of course, the presented illustration of electrical configuration for the electroplating system is one example configuration. Other configurations are possible as would be understood by one of skill in the art. For example, one power supply having separately controlled channels for the wafer (first cathode) and for the second cathode may be used, instead of two power supplies. In other embodiments, where multi-segmented second cathode is used, each segment may be powered separately form a dedicated power supply, or, a multi-channel power supply may be used to independently power the segments.

In one of the embodiments, the second cathode and the reference electrode are physically one entity, e.g., a metallic strip. The same strip of metal immersed into electrolyte can function as a second cathode when power is applied to it from the second cathode power supply, and as a reference electrode when power is turned off, but the potential is sensed through a sense lead connected to the main power supply. Therefore, in some embodiments instead of using two different members, the second cathode and the reference electrode are combined in one. In some embodiments, a plating method is provided, where the process is started with a potential-controlled wafer entry using an electrode immersed into electrolyte which is not externally energized but is configured to sense the potential. After the wafer is immersed, and the plating process has transitioned into current-controlled mode, current is supplied to this electrode from an external power supply, such that this electrode becomes negatively biased with respect to the anode, and starts serving as a second cathode, diverting a portion of current from the wafer. Thus, the same physical entity serves as a reference electrode in the potential-controlled phase of the process and has an ability to serve as a second cathode in the current-controlled phase of the process.

Positioning of the Reference Electrode

Correct positioning of the reference electrode is highly important for accurate measurement of potential, and consequently, for success of potential-controlled wafer entry. Specifically, in a system equipped with a HRVA, positioning of the reference electrode with respect to the HRVA is very important. Further, with entry of a tilted wafer into electrolyte, positioning of reference electrode with respect to the leading wafer edge (the edge which first contacts the electrolyte) and to the trailing wafer edge (the edge which contacts the electrolyte last), was found to have an impact on current profile experienced by the wafer during entry. Further, in those systems where the second cathode and the reference electrode are one physical entity the impact of DC current supplied to electrode on its ability to accurately measure potential needs to be considered.

Therefore, adaptation of potential-controlled wafer entry for use with HRVA, second cathode, and with tilted wafer entry will be discussed.

First it is important, that the reference electrode is placed in the plating system not behind HRVA with respect to the wafer, but preferably at a closer vertical elevation to the wafer, than the HRVA. In some embodiments, at least a portion of the reference electrode may be at the same vertical elevation as the HRVA, e.g., a cup with the reference electrode may be placed into one of the through-holes of the HRVA. In other embodiments, the entire reference electrode is located at a closer vertical elevation to the wafer than the HRVA. For example, in wafer-facing-down apparatus the reference electrode should not be located below HRVA. Oppositely, in a wafer-facing-up apparatus the reference electrode should not be located above HRVA. The important parameter here is the vertical elevation or the axis which connects centers of the wafer and the HRVA. With reference to elevation measured on this axis, the reference electrode should be located at the same level, or preferably closer to the wafer than the HRVA. While the horizontal positioning of the reference electrode, may be important in some embodiments, it is often less important that positioning of the electrode at a correct vertical elevation. Thus for example, the reference electrode can be located on the periphery of the wafer and HRVA in the horizontal direction, but is located closer to the wafer than the HRVA with respect to its vertical elevation.

Such positioning is needed to minimize any influence of the increasing current and any associated voltage drop on the potential measured by the reference electrode. For example, if the current during wafer entry changes from 0 to 10 A in a cell requiring −0.5V polarization vs. the electrolyte potential, setting the potential to that value in a region that "senses" the potential at the wafer edge without a significant potential drop allows a near constant current density of approximately 14 mA/cm$^2$ throughout the process. Conversely, if the reference electrode were placed in the chamber below a 1 ohm HRVA plate and the same constant potential were maintained, the current density initially would start at 14 mA/cm$^2$ (no ohmic drop in the cell) but would continuously decrease to about 0.71 mA/cm$^2$ (a 20 fold decrease). Alternatively, if the reference electrode were below the HRVA and the voltage were initially set to 10V, the current would start at an extremely high value because there is no ohmic loss at the beginning of the process, leading to damage to the leading edge of the wafer. Only then the current would decrease down to 14 mA/cm$^2$ achieved upon full immersion. This illustration also makes clear why controlling the cell potential (wafer to anode) in a HRVA-containing system can not achieve a constant current density entry. It is, therefore, important that the reference electrode is positioned in a location above or at the same level with the HRVA (in a wafer-facing-down system) and either very near the wafer surface and edge, or at a location that is connected to that location with little current flowing and where the voltage drop and ohmic contributions to the system are negligible and nearly constant compared to the surface kinetic resistances.

Figure 11:
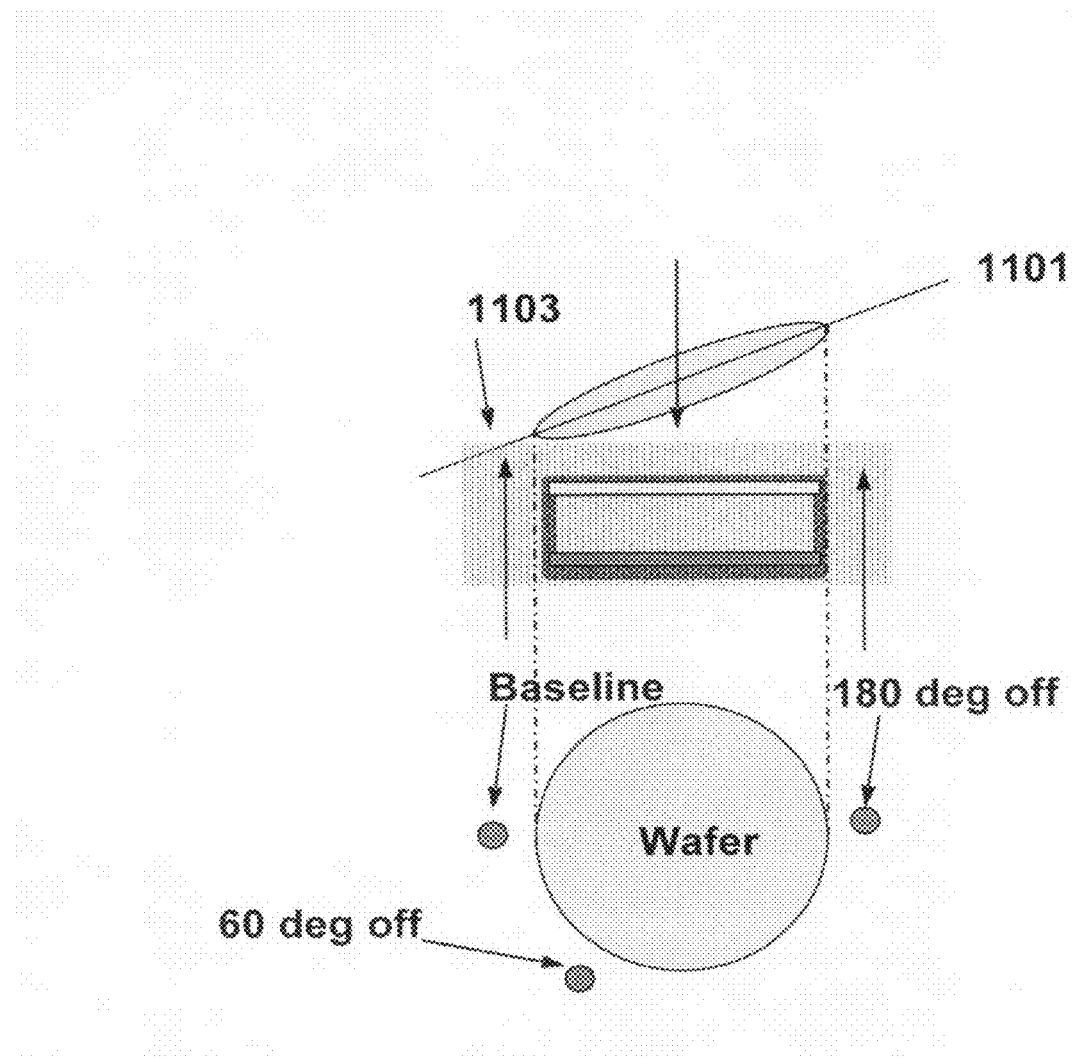
FIG. 11 illustrates a cross-sectional and a top schematic view of a wafer undergoing immersion at a tilt angle. Advantageous and disadvantageous positions for the reference electrode in relation to wafer entry trajectory are shown.
Figure 12:
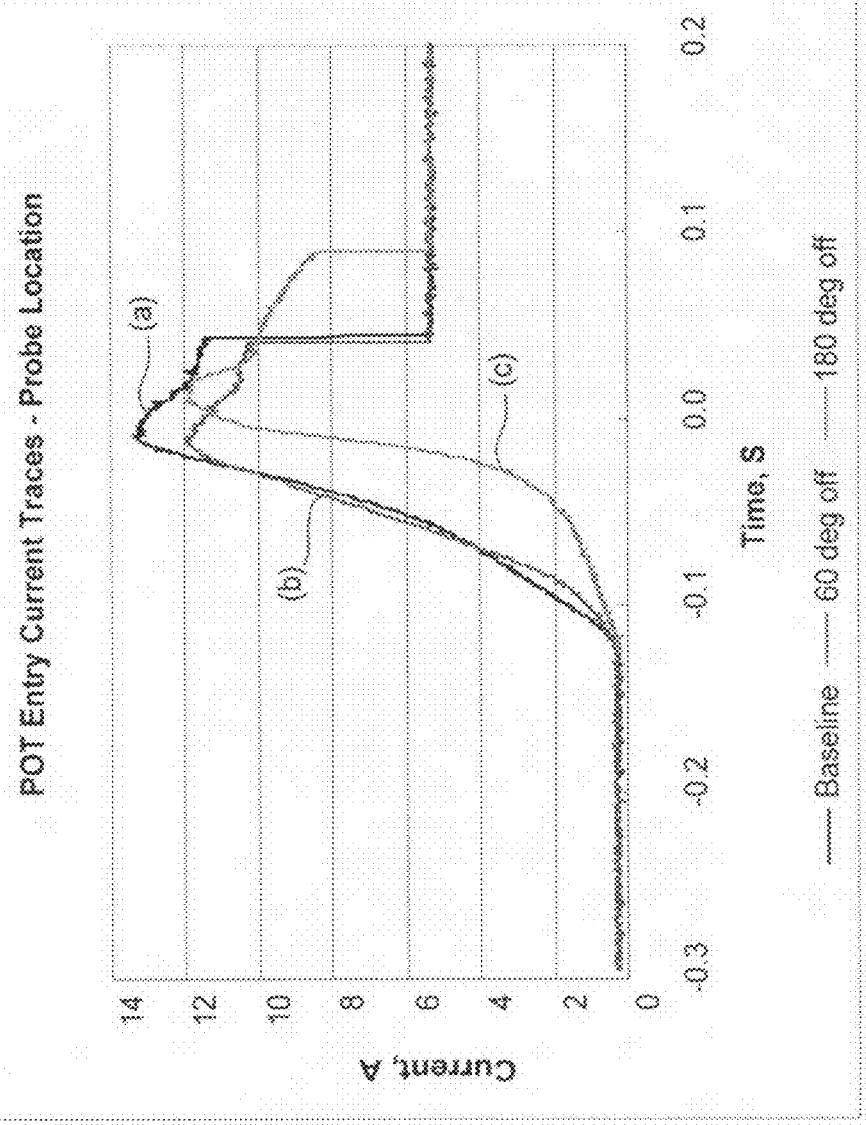
FIG. 12 is a plot showing current traces obtained for potential-controlled wafer entries, for different positions of a reference electrode.

When the wafer is tilted at an angle during entry into the electrolyte, the position of the reference electrode in the area above the HRVA plate can also be important, particularly in systems not having a dual cathode. FIG. 11 shows a side view of a tilted wafer during entry, and a top view of the same wafer with different positions of the reference electrode. The wafer is adapted to enter the electrolyte with a leading edge 1103, while the trailing end 1101 enters last. The vertex connecting the leading edge 1103 and the trailing edge 1101 is important for determining the preferred position of the reference electrode. Preferably, the electrode should be positioned close to the leading edge point of entry and close to or substantially on this vertex. This is because the potential is sensed through an entry gap (not shown) between the wafer and the anode chamber which is relatively closed and where the reference probe local potential is less influenced by the increasing flow of current, as compared to other positions between wafer and HRVA (e.g., 180° position), where increase in current flow is greater. FIG. 11 shows three positions for possible reference electrode location. The baseline position resides on the vertex connecting leading and trailing edges of the wafer, very close to the leading edge entry point. Other positions are shifted from the baseline position by 60° and 180° respectively. FIG. 12 shows three entry current traces for entry of a wafer having a 200 Å copper seed at a constant wafer potential of 0.6 V vs. reference electrode for three different reference electrode positions. The system was also equipped with a second cathode ring which was not energized during wafer entry. Curve (a) is the current profile for a reference electrode positioned at the leading edge (6 o'clock, baseline); curve (b) is the current profile obtained with a reference electrode positioned at 60 degrees from the leading edge; curve (c) is the current profile obtained with a reference electrode positioned at the trailing edge of the entry line (180 degrees off). Notably that the current density depicted in curve (c) starts at a low level and is delayed substantially when the reference electrode is in the "180 deg off" position. Further, the peak current is lower in both non-baseline cases. Comparison of the curve shapes and fluid dynamic modeling of the expected wafer coverage vs. time provides that the current density in the baseline condition is nearly constant, while in other cases, it is less than ideal. Therefore, in many embodiments the reference probe is placed closer to the leading edge of the wafer than to the trailing edge of the wafer and close to the vertex connecting the two edges.

As it was mentioned previously, in some embodiments, the second cathode electrode in the cell is also used as a reference electrode. In this case, the potential of the wafer during wafer entry is controlled without current passing though the second cathode. At a later stage the second cathode may be energized (negatively biased) to perform current extraction and edge profile tuning. In some embodiments the second cathode/reference electrode is a ring disposed peripherally to the wafer and generally above or at the same elevation as the HRVA. The second cathode is composed in this embodiment and/or is plated with the same metal that is being plated onto the wafer (e.g., copper). The second cathode is not energized until wafer entry is completed (i.e. at the open circuit potential) and it typically measures solution potential as 0 volts prior to entry. However, the potential monitored and controlled in this case is an average potential in the periphery region during the process, which is affected by the passage of current in the cell, and therefore differs from the result from using a reference probe at one peripheral azimuthal location (e.g., at the baseline as discussed above). While in some cases this design has lower ability to maintain constant current density at the wafer during entry as compared with a design having a dedicated reference electrode in a preferred location, this approach does simplify the overall cell design by eliminating the reference electrode as a separate entity, and maintains the surface of the electrode in a fresh state as the second cathode is plated.

It is notable, however, that even if a cell employs a distinct/separate reference electrode from a dual cathode, just the presence of the dual cathode (at open circuit) does have an effect on the cell potential at the reference probe, because the dual cathode is a low resistance electrical connection "buss" between the potential at the far and near end of the cell.

Illustrative Example of a Plating System

Figure 13:
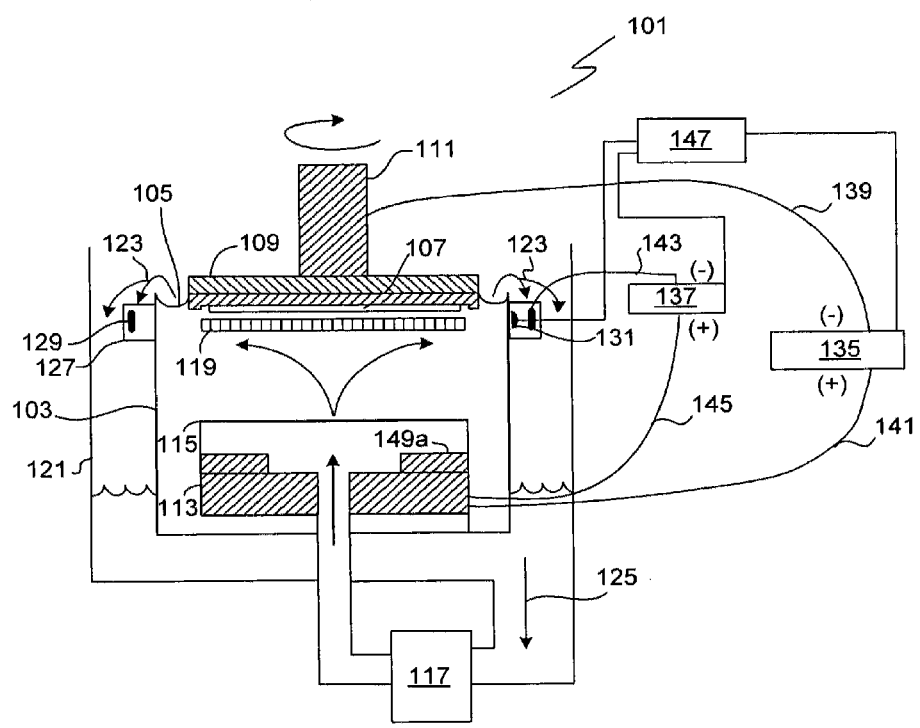
FIG. 13 is a cross-sectional schematic view of an electroplating apparatus in accordance with some embodiments of the invention.

An illustration of a plating system, which employs both a resistive element in close proximity to the wafer, a thieving cathode, and a separate reference electrode is shown in FIG. 13. This is one example of a plating system, and it is understood that the plating system can be modified within the spirit and scope of appended claims. For example, the thieving cathode and a reference electrode adpted for potential-controlled entry need not be present in one system in all embodiments.

Referring to FIG. 13, a diagrammatical cross-sectional view of an electroplating apparatus 101 is shown. The plating vessel 103 contains the plating solution, which is shown at a level 105. A wafer 107 is immersed into the plating solution and is held by a "clamshell" holding fixture 109, mounted on a rotatable spindle 111, which allows rotation of clamshell 109 together with the wafer 107. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, previously incorporated by reference, and was also described above with reference to FIG. 4. An anode 113 is disposed below the wafer within the plating bath 103 and is separated from the wafer region by a membrane 115, preferably an ion selective membrane. The region below the anodic membrane is often referred to as an "anode chamber" and electrolyte within this chamber as "anolyte". The ion-selective anode membrane 115 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes.

The plating solution is continuously provided to plating bath 103 by a pump 117. Generally, the plating solution flows upwards through an anode membrane 115 and the HRVA 119 (ionically resistive ionically permeable element located in close proximity of the wafer) to the center of wafer 107 and then radially outward and across wafer 107. In alternative embodiments, the plating solution may be provided into anodic region of the bath from the side of the plating cell 103.

In other embodiments plating solution may be supplied through separate inlets into anodic and cathodic regions of the plating cell.

The plating solution then overflows plating bath 103 to an overflow reservoir 121 as indicated by arrows 123. The plating solution is then filtered (not shown) and returned to pump 117 as indicated by arrow 125 completing the recirculation of the plating solution.

A second cathode (thieving cathode) chamber 127, housing the second cathode 129 is located on the outside of the plating vessel 103 and peripheral to the wafer. It is understood, that this is an illustrative embodiment, and, generally, the second cathode can be positioned at a number of locations within the main plating chamber (vessel) or outside.

The plating solution overflows a weir wall of the plating vessel into the second cathode chamber. In certain embodiments, the second cathode chamber is separated from the plating bath 103 by a wall having multiple openings covered by an ion-permeable membrane. The membrane allows ionic communication between the plating cell and the second cathode chamber, thereby allowing the current to be diverted to the second cathode. The porosity of this membrane is such that it does not allow particulate material to cross from the second cathode chamber 127 to the plating bath 103 and result in the wafer contamination. The openings in the walls may take the form of rounded holes, slots, or other shapes of various sizes. In one embodiment, the openings are slots having dimensions of, e.g., about 12 mm by 90 mm. Other mechanisms for allowing fluidic and/or ionic communication between the second cathode chamber and the main plating vessel are within the scope of this invention. Examples include designs in which the membrane, rather than an impermeable wall, provides most of the barrier between plating solution in the second cathode chamber and plating solution in the main plating vessel. A rigid framework may provide support for the membrane in such embodiments.

A reference electrode 131 is located in the illustrated embodiment on the outside of the plating vessel 103 in the same chamber as the second cathode. In this specific example, the second cathode is C-shaped and resides on the periphery of the plating chamber and the reference electrode is rod-shaped and resides in the proximity of the discontinuous location of the C-shaped second cathode and close to the leading edge of the wafer. A reference electrode is connected to a controlling circuit and is typically employed when electroplating at a controlled potential is desired. Generally, it is advantageous to minimize the distance between the wafer and the reference electrode in order to achieve more accurate potential control. Therefore in some embodiments, the reference electrode is located in close proximity to the wafer, such that resistance between the wafer and the reference electrode is minimal. In many cases, the reference electrode is used only during the very rapid entry phase of the wafer immersion (which often occurs much faster than one second), as well as at a time when the secondary cathode is not energized. Therefore, since there is very little or no current flowing outside of the wafer holder/anode chamber gap under such circumstances, the potential measured by the reference electrode is nearly identical at all locations outside the gap as to the potential at the gap outer edge. This is analogous to the position insensitivity of the dual cathode and its use, i.e. the exact location of the reference electrode is relatively unimportant if it lies outside the gap. Specifically, in some embodiments the reference electrode is located at the edge of the gap (about 5 mm from the wafer edge), while in other cases it is located 50 mm from the wafer edge gap. However, if one wants to avoid the small voltage drop in the gap region, as in one embodiment, a cup containing the reference electrode is positioned at the periphery of and within one of the through-holes of the ionically resistive element 119. While a variety of reference electrodes may be used, in some embodiments, the reference electrode includes the same material that is being plated (e.g., a copper reference electrode may be used during copper plating).

Two DC power supplies 135, and 137 can be used to control current flow to the wafer 107 and to the second cathode 129 respectively. A power supply 135 has a negative output lead 139 electrically connected to wafer 107 through one or more slip rings, brushes and contacts (not shown). The positive output lead 141 of power supply 135 is electrically connected to an anode 113 located in plating bath 103. Similarly, a power supply 137 has a negative output lead 143 electrically connected to the second cathode, and a positive output lead 145 electrically connected to an anode 113. Alternatively, one power supply with multiple independently controllable electrical outlets can be used to provide different levels of current to the wafer and to the second cathode. The reference electrode 131 is connected to the controller 147, through main power supply 135, as is shown in additional detail in FIG. 10. FIG. 10 also shows the sense lead finger at the wafer surface, which is not shown in FIG. 13 to preserve clarity. The power supplies 135, and 137, and a reference electrode 131 can be connected to a controller 147, which allows modulation of current and potential provided to the elements of electroplating cell. For example, the controller may allow electroplating either in current-controlled or potential-controlled regime. The controller may include program instructions specifying current and voltage levels that need to be applied to various elements of the plating cell, as well as times at which these levels need to be changed. For example, it may include program instructions for transitioning from potential-control to current-control upon immersion of the wafer into the plating bath.

During use, the power supplies 135 and 137 bias both the wafer 107 and the second cathode 129 to have a negative potential relative to anode 113. This causes an electrical current flowing from anode 113 to the wafer 107 to be partially or substantially diverted to the second cathode 129. The electrical circuit described above may also include one or several diodes that will prevent reversal of the current flow, when such reversal is not desired. An undesired current feedback may occur during plating, since the anode 113 which is set at ground potential is the common element of both the wafer and the thief circuits.

The level of current applied to the second cathode is typically set to lower values than the level of current applied to the wafer, with the second cathode current being presented as a percentage of the wafer current. For example, a 10% second cathode current corresponds to a current flow at the second cathode that is 10% of the current flow to the wafer. The direction of the current as used herein is the direction of net positive ion flux. During electroplating, an electrochemical reduction (e.g. $Cu^{2+}+2\ e^-=Cu^0$) occurs both on the wafer surface (first cathode) and on the second cathode surface, which results in the deposition of the electrically conductive layer (e.g. copper) on the surfaces of both the wafer and the thief. Since the current is diverted from the wafer to the second cathode, the thickness of deposited copper layer at the edge of the wafer is diminished. This effect typically occurs in the outer 20 mm of the wafer, and is especially pronounced in its outer 10 mm, particularly when plating is performed on thin seed layers. The use of thieving cathode 129 can substantially improve center-edge nonuniformity resulting from terminal and field effects. Second cathode can be used either alone or in conjunction with a variety of fixed or dynamic shields.

The ionically resistive ionically permeable element (i.e. HRVA) 119 is located in close proximity of the wafer (within 10 mm, preferably within 5 mm) and serves as a constant current source to the wafer. The element contains a plurality of 1D through holes and has been described in detail above.

Additionally, one or more shields, such as 149a can be positioned within the chamber. The shields are usually ring-shaped dielectric inserts, which are used for shaping the current profile and improving the uniformity of plating, such as those described in U.S. Pat. No. 6,027,631 issued to Broadbent, which is herein incorporated by reference in its entirety and for all purposes. Of course other shield designs and shapes may be employed as are known to those of skill in the art.

In general, the shields may take on any shape including that of wedges, bars, circles, ellipses and other geometric designs. The ring-shaped inserts may also have patterns at their inside diameter, which improve the ability of the shields to shape the current flux in the desired fashion. The function of the shields may differ, depending on their position in the plating cell. The apparatus of the present invention can include any of the static shields, as well as variable field shaping elements, such as those described in U.S. Pat. No. 6,402,923 issued to Mayer et al., or segmented anodes, such as described in a U.S. Pat. No. 6,497,801 issued to Woodruff et al, both of which are herein incorporated by reference in their entireties.

The apparatus configuration described above is an illustration of one embodiment of the present invention. Those skilled in the art will appreciate that alternative plating cell configurations that include an appropriately positioned second cathode may be used. While shielding inserts are useful for improving plating uniformity, in some embodiments they may not be required, or alternative shielding configurations may be employed.

While the second cathode need not necessarily be remotely positioned, one such configuration with a remote second cathode will be described as an example.

Figure 14:
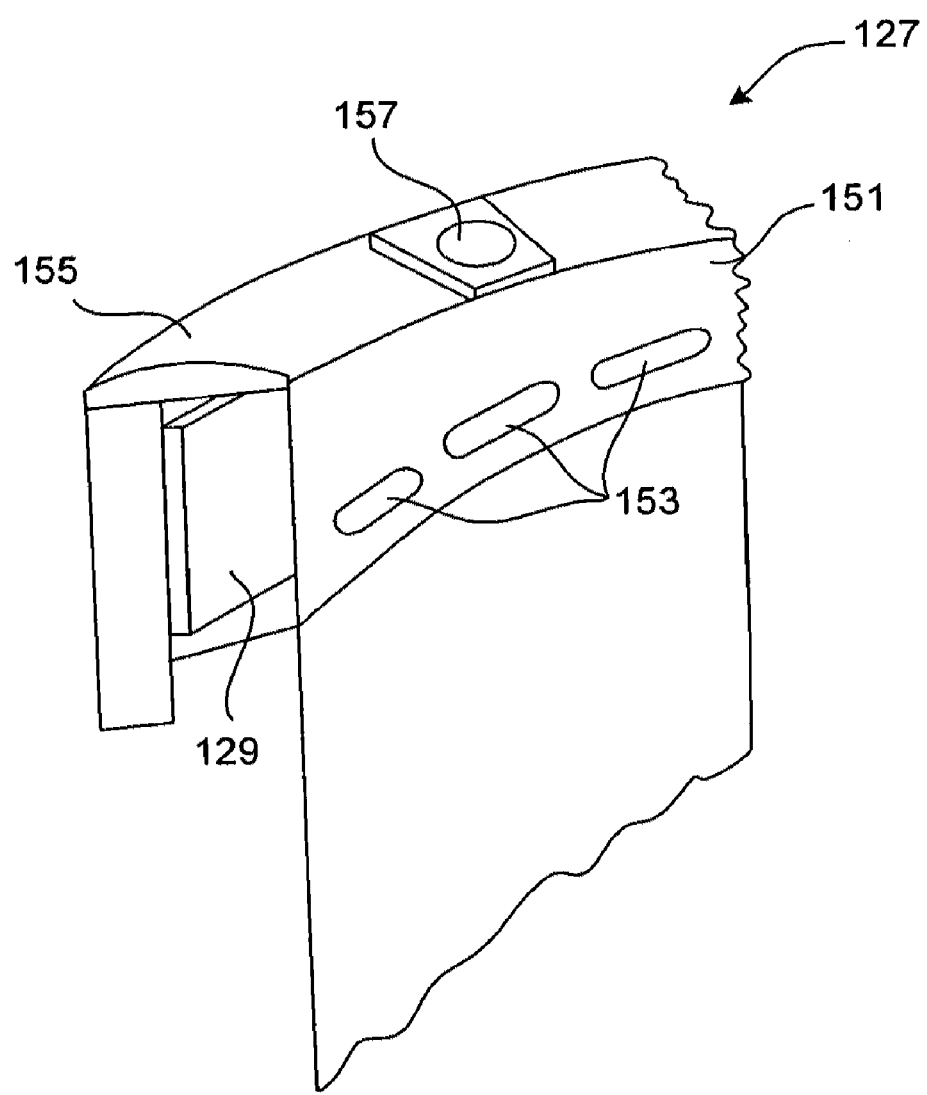
FIG. 14 is a view of a separate chamber on the periphery of the main plating chamber housing the second cathode.

An example of a remotely positioned second cathode is illustrated in FIG. 14, which shows a sectional view of the second cathode chamber 127 of FIG. 13. The chamber provides an annularly shaped space located outside of the plating bath and extending around the perimeter of the plating bath at substantially the same vertical elevation as the wafer, where the vertical elevation of the wafer refers to its position within the vessel during plating. The second cathode chamber is mounted on the outside of the plating vessel wall 151, and is designed to be in ionic communication with the plating vessel through a series of membrane-covered openings 153 in the wall 151. The second cathode chamber is replenished with the plating solution at least in part by an overflow from the main plating vessel. The top portion of the second cathode chamber is covered by an electrode cover 155, which has a number of openings, such as opening 157. The plating solution overflows into the second cathode chamber through weir walls located at these openings. Rapid refreshment of the plating solution, which can be achieved by rapid overflow into the second cathode chamber, prevents passivation of the second cathode 129 which can occur during electroplating and stripping processes. The rate of overflow may be controlled, for example, by varying the percentage of open area in the electrode cover 155. Thus, for example, at least about 5, 10, 50 or 100% of an electrode cover area may be open for overflow.

Ionic communication between second cathode 129 and the main plating bath is effected by membrane openings 153. The membrane covering these openings has a porosity sufficient for ionic species, such as cupric ions or protons, to cross the membrane and provide current flow to the second cathode. This membrane, however, is capable of blocking larger particles, which may be generated at the second cathode surface from passing through the membrane to the main plating cell and contaminating the wafer. Generally, it is desirable to prevent particulates greater in size than 0.05 microns from passing through the membrane. This can be achieved by employing a membrane composed of a polymeric material with an average pore or channel size of not greater than about 0.05 microns, and preferably as small as 1-10 nm. In certain embodiments, porous polymeric material is made from a polyolefin or other wettable polymeric material that is resistant to attack from the plating solution. Suitable examples of membrane material include: napped polypropylene available from Anode Products, Inc. located in Illinois; spunbound snowpro polypropylene and various polyethylene, polysulfone, RYTON, and TEFLON materials in felt, monofilament, filament and spun forms available from various suppliers including Entegris of Chaska, Minn. In particular, ionomeric cation exchange membranes, such as Nafion supplied by DuPont de Nemours Co. are useful for this application.

In one embodiment, the second cathode 129 is an annularly shaped strip of metal located within the second cathode chamber 127 and connected to a power supply by, for example, a feed-through connector attached to an electrode cable (not shown). The metal composing the second cathode or its surface is preferably inert under electroplating conditions. Examples of inert metals which can be used as a second cathode include tantalum, tungsten, titanium, palladium or platinum, a palladium or platinized metal substrate such as titanium or tungsten or tantalum, iridium, iridized titanium and the like. In some embodiments, it is preferable to use the same material that is being plated as the second cathode material. For example, a copper-comprising second cathode may be used when copper is plated.

The dimensions of the second cathode chamber and of the second cathode may vary depending on the needs of electroplating process. In one example, the second cathode is a strip of metal, having a thickness of about 0.1-2 mm, and a height of about 0.5-5 cm. The second cathode chamber in this embodiment can have a width of about 0.5-3 cm and a depth of about 1-9 cm. Such chamber can be mounted onto the main plating vessel, having an outer diameter of 45-61 cm and a depth of about 30-61 cm. Examples of other cathode configurations include circular bars (O-shaped toroids), C-shaped bars, coils having a circular configuration in which individual coils define a small circle and the overall coiled structure surrounds the main plating vessel in the second cathode chamber.

Figure 15:
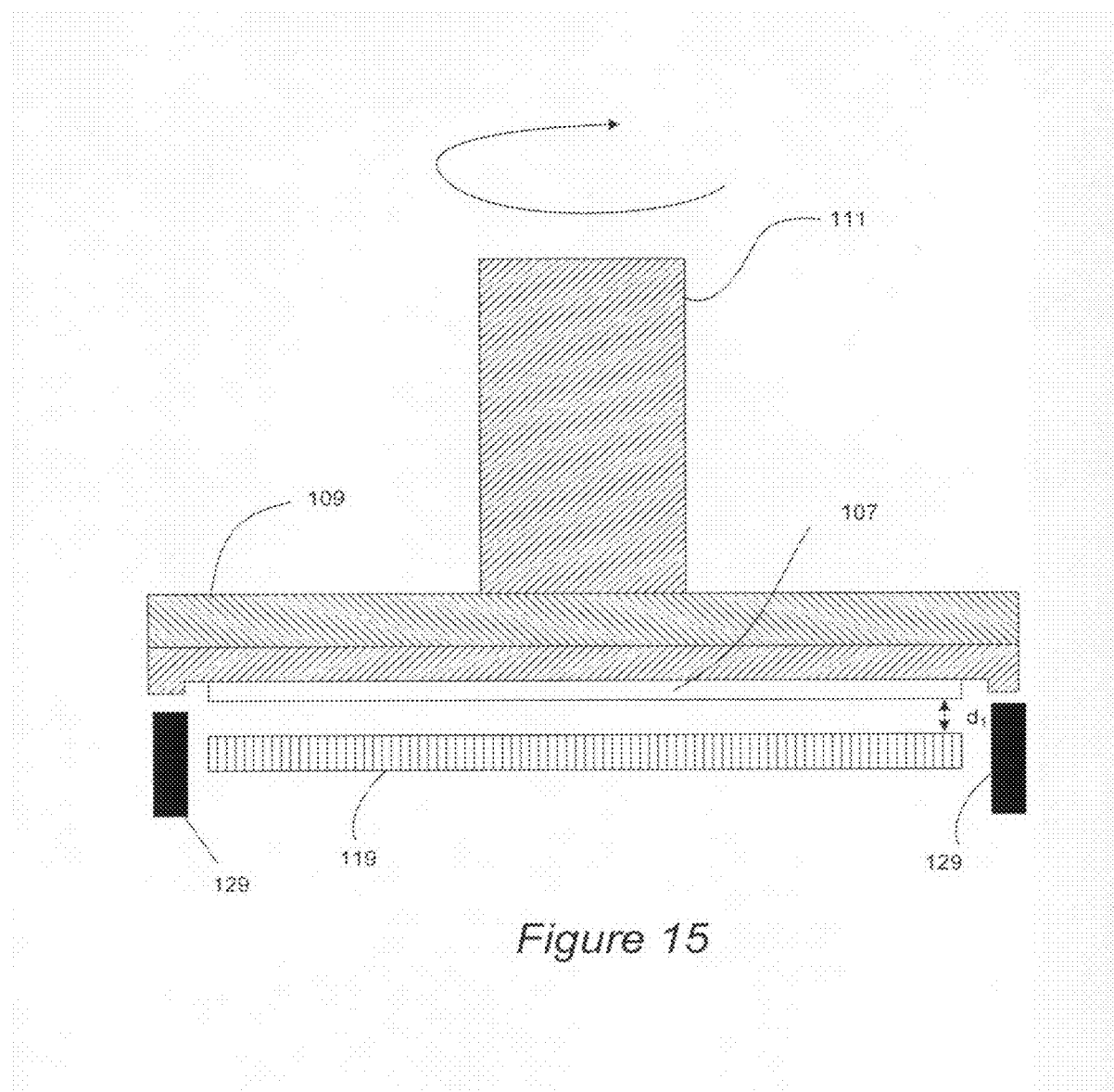
FIG. 15 is a cross-sectional view of the top portion of electroplating apparatus illustrating a wafer, a HRVA, and a second cathode.

A close-up view of another configuration comprising an ionically resistive ionically permeable element and a second cathode is illustrated in FIG. 15. Only the wafer 107, the second cathode 129, and the ionically resistive element 119 are illustrated to preserve clarity. In this configuration the second cathode is located close to the wafer, but, as it was previously mentioned, the positioning of the second cathode is not critical particularly when the gap between the wafer and or wafer holder and the HRVA plate is small. The ionically resistive ionically permeable HRVA element is located opposite the wafer and parallel to it at a close distance $d_1$. This distance, in one characterization is less than about 5 mm, or less than about 3 mm. In a different characterization, the distance is not greater than about 5% (more preferably about 2%) of the diameter of the work piece's circular region.

Figure 16:
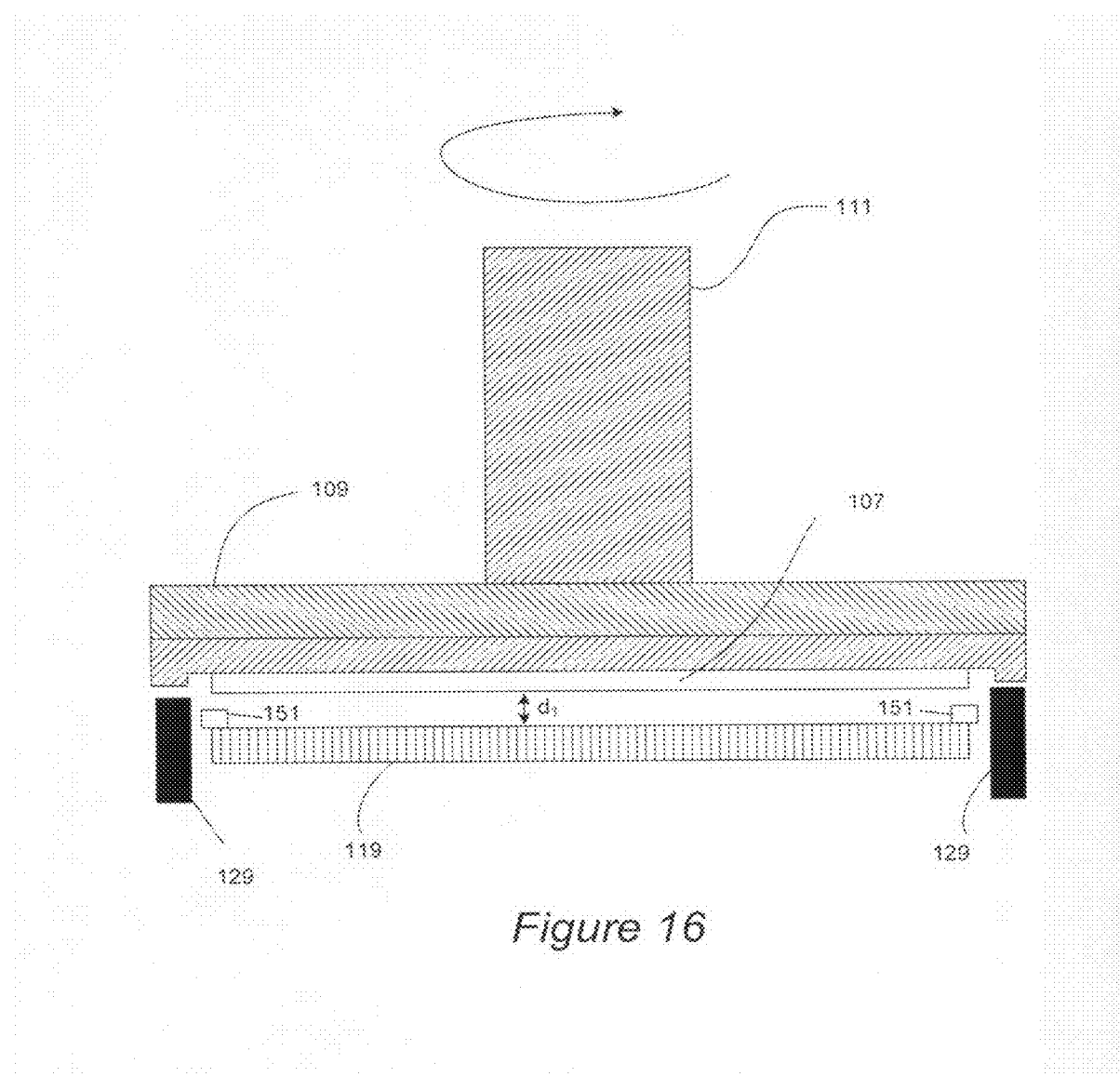
FIG. 16 is a cross-sectional view of the top portion of electroplating apparatus illustrating a wafer, a HRVA, and a second cathode, and a stationary shield positioned above HRVA and on the periphery of HRVA.

Another embodiment of a configuration employing an ionically resistive element is shown in FIG. 16. In this embodiment, a static insulating shield 151 resides about the perimeter of the resistive element to further improve edge-center plating uniformity. Optionally, the configuration also includes a second cathode 129. The shield may reside directly on the resistive element and may eclipse some of the through-holes on the periphery of the resistive element. Generally, in the lateral (x-direction) such shield can be completely peripheral to the resistive element (outside its perimeter), partially peripheral (a portion of the shield is outside and a portion is inside the perimeter, as shown), or fully on top of the outer edge of the element (completely inside the perimeter of the resistive element). Vertically (in y-direction) the shield resides between the wafer and the resistive element, at the same level or below.

When the shield resides above the HRVA it can be used to make the peripheral gap smaller. This is particularly advantageous when a thief cathode is used. By using different shields and the same HRVA the relative size of the peripheral gap vs. HRVA-to-wafer gap can be modulated. A separate function of the shield, according to some embodiments, is to eclipse some holes of the HRVA, thereby blocking current passing through those holes. The shield may be configured (by its size, location, dynamic movement, etc.) to change the number and location of open holes so as to tune current profile for a particular application. Advantageously, these parameters can be modulated by using the same HRVA and selecting a shield suitable for a particular application, e.g., creating a desired peripheral gap, a desired pattern of blocked holes, etc. While in some embodiments the static shield is a ring, as illustrated in FIG. 16, in other embodiments the shield can be bat-wing shaped, or have another azimuthally asymmetric shape.

In some embodiments the hole-blocking shield, e.g., a peripheral ring, or an azimuthally asymmetric shield is placed between the HRVA and an anode (e.g., below the HRVA in wafer-facing-down systems).

The shield can take the form of an insulating ring. In other embodiments, a dynamic shielding system may be employed instead of a static shield. For example an iris (a dynamic shield configured for changing aperture diameter during plating) or other dynamic shields such as those described in U.S. Pat. No. 6,402,923 titled "METHOD AND APPARATUS FOR UNIFORM ELECTROPLATING OF INTEGRATED CIRCUITS USING A VARIABLE FIELD SHAPING ELEMENT" by Mayer et al., issued on Jun. 11, 2002, which is herein incorporated by reference in its entirety and for all purposes, may be used to account for reduction in terminal effect which occurs during plating.

The top view of an ionically resistive ionically permeable element 119 having a static shield 151 disposed about its perimeter and above the element, is illustrated in FIG. 17.

Positioning and Shape of an Anode

In the presence of a HRVA which serves as a virtual anode, the positioning of the actual anode (a positively biased member of the plating chamber) becomes relatively unimportant. Therefore, while in some embodiments the actual anode (a positively biased electrode) is aligned with the wafer and with the resistive element and is disposed opposite to the wafer surface, in other embodiments, the anode is not aligned with the wafer, as it may be shifted to the side with respect to the wafer, be placed in a separate chamber, or may have dimensions (e.g., diameter) substantially different from those of the wafer. In some embodiments, the anode is disk-shaped and is aligned with the wafer. In other embodiments the anode may be positioned asymmetrically. In yet other embodiments, multiple anodes are used.

One anode design that can be used employs multiple anode segments, each of which can be separately controlled. The anode segments can be arranged so that greater current levels are provided from segments located proximate the center of the work piece. Concentrically arranged anode segments provide this capability. See U.S. Pat. No. 6,773,571 titled "METHOD AND APPARATUS FOR UNIFORM ELECTROPLATING OF THIN METAL SEEDED WAFERS USING MULTIPLE SEGMENTED VIRTUAL ANODE SOURCES" by Mayer et al, issued Aug. 10, 2004, which is herein incorporated by reference in its entirety and for all purposes.

In another embodiment, an azimuthally asymmetric anode is employed. The work piece rotates with respect to the anode to produce a time averaged current source that provides higher currents to the center of the work piece than to the edge regions. Examples of this apparatus are depicted in U.S. Pat. No. 6,919,010 issued Jul. 19, 2005 by Mayer et al. and titled "UNIFORM ELECTROPLATING OF THIN METAL SEEDED WAFERS USING ROTATIONALLY ASYMMETRIC VARIABLE ANODE CORRECTION" which is incorporated herein by reference for all purposes.

In the concentric anode embodiment, the anodes can be accompanied by electrically and ionically insulating focusing cylinders that can mate with the lower surface of the HRVA. In other embodiments the focusing walls extend upward from the anodes but do not come into contact with the HRVA. When an inner anode is then energized, current is preferentially directed to the center and cannot leak to the edge through a low resistance path. In other embodiments the focusing walls extend upward from the anodes but do not come into contact with the HRVA.

The combinations of HRVA having 1D through-holes with different anode configurations can be configured similarly to the combinations of a porous membrane with different anode configurations described in detail in U.S. patent application Ser. No. 11/040/359 titled "HIGH RESISTANCE IONIC CURRENT SOURCE" filed on Jan. 20, 2005 by Mayer et al., which is herein incorporated by reference in its entirety and for all purposes.

Notably, however, in an embodiment, where a segmented anode is used, and where one or more of the anode segments are surrounded with focusing walls which extend vertically and mate with the HRVA having 1D through-holes, the effect will be significantly different and more advantageous than in the case where a membrane having 3-D porous network is used. Advantageously, walls mating with a HRVA having 1D through-holes will essentially block these through-holes from electrolyte, thereby creating distinct HRVA segments aligned with anode segments and electrically isolated from each other by blocked areas. In contrast, in a three-dimensional porous network even if the walls block the pores, the current can still travel laterally through the 3-D porous plate, thereby reducing alignment of current with the anode segments. Therefore, the use of a HRVA having 1D through-holes in conjunction with a segmented anodes having focusing walls mating with the HRVA, allows better control over plating uniformity. Such HRVA is referred to as a segmented HRVA having 1D through-holes.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. Further it is understood that many features presented in this application, can be practiced separately as well as in any suitable combination with each other, as will be understood by one of skill in the art.

What is claimed is:

1. An apparatus for electroplating a layer of metal onto a work piece surface having edge regions around a center region, the apparatus comprising:
   (a) a plating chamber;
   (b) a work piece holder configured for holding the work piece in the plating chamber and rotating the work piece;
   (c) electrical contacts arranged to make electrical connection to the work piece at one or more locations on the edge regions, such that the work piece is configured to serve as a cathode;
   (d) an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder, during plating in the plating chamber, wherein substantially all perforations have a principal dimension or a diameter of the opening on the surface of the element facing the surface of the work piece of no greater than about 5 mm; and
   (e) a stationary segmented second cathode comprising segments configured to divert different amounts of ionic current from different azimuthal positions of the work piece.

2. The apparatus of claim 1, wherein the ionically resisitive ionically permeable element is a disk having between about 6,000-12,000 perforations.

3. The apparatus of claim 1, wherein the ionically resistive ionically permeable element is configured to be substantially coextensive with the work piece.

4. The apparatus of claim 3, wherein the ionically resistive ionically permeable element has a diameter of between about 150-450 mm and a thickness of between about 5-50 mm.

5. The apparatus of claim 1, wherein the ionically resistive ionically permeable element comprises non-uniform perforations in the central portion of the element, and uniform perforations in the peripheral portion of the element.

6. The apparatus of claim 5, wherein one or more perforations in the central portion of the element are blocked to provide a non-uniform distribution of perforations in the center.

7. The apparatus of claim 1, wherein the segments of the segmented second cathode are configured to reside at different azimuthal positions relative to the work piece and to be separated from the work piece by an electrolyte-filled gap, and to receive different levels of power at one time such as to minimize differences in current density experienced by different regions of a work piece.

8. The apparatus of claim 7, wherein each segment is configured to receive a level of power that changes over time in correlation with rotation of the work piece.

9. The apparatus of claim 1, further comprising a static shield positioned to reside in close proximity to the perforations of the ionically resistive ionically permeable element between the ionically resistive ionically permeable element and the work piece during plating wherein the shield is positioned to eclipse at least some of the perforations at the edge region.

10. The apparatus of claim 1, further comprising a rotatable shield positioned to reside in close proximity to the perforations of the ionically resistive ionically permeable element between the ionically resistive ionically permeable element and the work piece during plating wherein the shield is positioned to eclipse at least some of the perforations and to be rotated during plating.

11. The apparatus of claim 10, wherein the rotatable shield is configured to rotate such as to minimize differences in current density at different azimuthal positions of the work piece.

12. The apparatus of claim 10, wherein the rotatable shield is configured to rotate at the same speed as the work piece.

13. The apparatus of claim 1, further comprising:
   (f) a reference electrode in operable communication with a control circuit; and
   (g) a power supply in operable communication with the power contacts, the anode, and with the control circuit, wherein the apparatus is configured for providing a potential-controlled entry of the work piece into the electrolyte.

14. The apparatus of claim 13, further comprising at least one sense lead in operable communication with the control circuit, the sense lead comprising at least one sense contact contacting the surface of the work piece, the sense lead being configured for sensing potential at least one point on the surface of the work piece.

15. A method of plating a layer of metal onto a work piece, the method comprising:
   (a) providing the work piece to an electroplating apparatus, wherein the apparatus comprises an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder, during plating in the plating chamber, wherein substantially all perforations have a principal dimension or a diameter of the opening on the surface of the element facing the surface of the work piece of no greater than about 5 mm;
   (b) immersing a working surface of the work piece into an electrolyte comprising metal ions;
   (c) supplying power to the work piece, such that the work piece serves as a cathode;
   (d) plating the metal, while rotating the work piece and supplying power to a segmented second cathode such as to divert different amounts of ionic current from different azimuthal positions of the work piece, wherein levels of power applied to a segment of the segmented second cathode change over time in correlation with the rotation of the work piece.

16. The method of claim 15, wherein different levels of power are supplied to different segments of the segmented second cathode at one time.

17. The method of claim 15, wherein work piece is asymmetrical, and wherein levels of power applied to a segment of the segmented second cathode are changed over time in correlation with the rotation of the work piece, such as to minimize differences in current density at the surface of the workpiece.

18. The method of claim 15, wherein segments of the segmented second cathode reside at different azimuthal positions relative to the work piece.

19. The method of claim 15, wherein different segments are connected to different power supplies.

20. An apparatus for electroplating a layer of metal onto a work piece surface having edge regions around a center region, the apparatus comprising:
(a) a plating chamber;
(b) a work piece holder for holding the work piece in the plating chamber;
(c) electrical contacts arranged to make electrical connection to the work piece, wherein the work piece is configured to serve as a cathode;
(d) an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder during plating in the plating chamber, wherein substantially all perforations have a principal dimension or a diameter of a perforation opening on the surface of the element facing the surface of the work piece of no greater than about 5 mm; and
(e) a rotatable shield positioned to reside in close proximity to the perforations of the ionically resistive ionically permeable element between the ionically resistive ionically permeable element and the work piece during plating wherein the shield is positioned to eclipse at least some of the perforations of the ionically resistive ionically permeable element, wherein the rotatable shield is configured to rotate at the same speed as the work piece during plating.

21. The apparatus of claim 20, wherein the ionically resistive ionically permeable element is a disk having between about 6,000-12,000 perforations.

22. The apparatus of claim 20, wherein the ionically resistive ionically permeable element is configured to be substantially coextensive with the work piece.

23. The apparatus of claim 22, wherein the ionically resistive ionically permeable element has a diameter of between about 150-450 mm and a thickness of between about 5-50 mm.

24. The apparatus of claim 20, wherein the ionically resistive ionically permeable element comprises non-uniform perforations in the central portion of the element, and uniform perforations in the peripheral portion of the element.

25. The apparatus of claim 24, wherein one or more perforations in the central portion of the element are blocked to provide a non-uniform distribution of perforations in the center.

26. The apparatus of claim 20, wherein the rotatable shield is configured to rotate during plating and eclipse the perforations such as to minimize differences in current density at different azimuthal positions of the work piece.

27. A method of plating a layer of metal onto a work piece, the method comprising:
(a) providing the work piece to an electroplating apparatus, wherein the apparatus comprises an ionically resistive ionically permeable element having an ionically resistive body with a plurality of perforations made in the body such that the perforations do not form communicating channels within the body, wherein said perforations allow for transport of ions through the element, and wherein the element is positioned to have one surface facing the work piece surface, and located within about 5 mm of said work piece surface, when held in plating position by the work piece holder, during plating in the plating chamber, wherein substantially all perforations have a principal dimension or a diameter of the opening on the surface of the element facing the surface of the work piece of no greater than about 5 mm;
(b) immersing a working surface of the work piece into an electrolyte comprising metal ions;
(b) supplying power to the work piece such that the work piece serves as a cathode;
(d) plating the metal, while rotating the work piece and rotating a shield residing between the work piece and the ionically resistive ionically permeable element, wherein the shield eclipses at least some of the perforations of the ionically resistive ionically permeable element and wherein the rotating shield is rotated at the same speed as the work piece.

28. The method of claim 27, wherein the rotation of the shield minimizes the differences in current density at different azimuthal regions of the work piece.

29. The method of claim 27, wherein the work piece is asymmetrical.

30. An apparatus for electroplating a layer of metal onto a work piece surface, the apparatus comprising:
(a) a plating chamber;
(b) a work piece holder configured for holding the work piece in the plating chamber and rotating the work piece during electroplating;
(c) electrical contacts arranged to make electrical connection to the work piece at one or more locations on the edge regions, such that the work piece is configured to serve as a cathode; and
(d) a stationary segmented second cathode comprising segments configured to divert different amounts of ionic current from different azimuthal positions of the work piece.

31. An apparatus for electroplating a layer of metal onto a work piece surface, the apparatus comprising:
(a) a plating chamber;
(b) a work piece holder configured for holding the work piece in the plating chamber and rotating the work piece during electroplating;
(c) electrical contacts arranged to make electrical connection to the work piece seed layer at one or more locations on the edge regions, such that the work piece is configured to serve as a cathode; and
(d) a stationary segmented second cathode comprising a plurality of segments; and
(e) a controller comprising program instructions for providing different power levels to different segments of the segmented second cathode.

32. The apparatus of claim 31, wherein the controller comprises program instructions for changing levels of power applied to a segment of the segmented second cathode over time in correlation with the rotation of the work piece.

33. The apparatus of claim 31, wherein the stationary segmented cathode is configured to be separated from the work piece by an electrolyte-filled gap during plating.

34. A method of plating a layer of metal onto a work piece, the method comprising:

(a) providing the work piece to an electroplating apparatus configured for cathodically biasing the work piece during electroplating, wherein the apparatus comprises a stationary segmented second cathode separated from the work piece by an electrolyte-filled gap;
(b) immersing a working surface of the work piece into an electrolyte comprising metal ions;
(c) supplying power to the work piece such that the work piece serves as a cathode;
(d) plating the metal, while rotating the work piece and supplying power to the segmented second cathode such as to divert different amounts of ionic current from different azimuthal positions of the work piece, wherein levels of power applied to a segment of the segmented second cathode change over time in correlation with the rotation of the work piece.

* * * * *